(12) United States Patent
Takeya et al.

(10) Patent No.: US 6,836,498 B2
(45) Date of Patent: Dec. 28, 2004

(54) SEMICONDUCTOR LASER, SEMICONDUCTOR DEVICE AND NITRIDE SERIES III-V GROUP COMPOUND SUBSTRATE, AS WELL AS MANUFACTURING METHOD THEREOF

(75) Inventors: Motonobu Takeya, Miyagi (JP); Katsunori Yanashima, Kanagawa (JP); Takeharu Asano, Miyagi (JP); Osamu Goto, Miyagi (JP); Shinro Ikeda, Miyagi (JP); Katsuyoshi Shibuya, Miyagi (JP); Tomonori Hino, Miyagi (JP); Satoru Kijima, Miyagi (JP); Masao Ikeda, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/874,828

(22) Filed: Jun. 5, 2001

(65) Prior Publication Data

US 2002/0064195 A1 May 30, 2002

(30) Foreign Application Priority Data

Jun. 5, 2000 (JP) .................................... P2000-168312
Aug. 30, 2000 (JP) .................................... P2000-260722

(51) Int. Cl.$^7$ ................................................ H01S 5/00
(52) U.S. Cl. ............................. 372/45; 372/43; 372/44; 372/46; 372/47; 372/48; 372/49; 372/50
(58) Field of Search ....................... 372/13–50; 257/615

(56) References Cited

U.S. PATENT DOCUMENTS

| | | | | |
|---|---|---|---|---|
| 5,249,250 A | * | 9/1993 | Yamada et al. ............. | 385/122 |
| 5,987,048 A | * | 11/1999 | Ishikawa et al. ............. | 372/46 |
| 6,015,979 A | * | 1/2000 | Sugiura et al. ............. | 257/86 |
| 6,153,010 A | * | 11/2000 | Kiyoku et al. ............. | 117/95 |
| 6,225,650 B1 | * | 5/2001 | Tadatomo et al. .......... | 257/190 |
| 6,294,440 B1 | * | 9/2001 | Tsuda et al. ............. | 438/479 |
| 6,377,596 B1 | * | 4/2002 | Tanaka et al. ............. | 372/45 |
| 6,498,048 B2 | * | 12/2002 | Morita ....................... | 438/22 |
| 6,509,579 B2 | * | 1/2003 | Takeya et al. ............. | 257/22 |
| 6,586,316 B2 | * | 7/2003 | Tsuda et al. ............. | 438/479 |
| 6,606,335 B1 | * | 8/2003 | Kuramata et al. ............ | 372/45 |
| 2003/0020087 A1 | * | 1/2003 | Goto et al. ................ | 257/103 |
| 2003/0139037 A1 | * | 7/2003 | Kobayashi et al. ......... | 438/681 |

* cited by examiner

*Primary Examiner*—Don Wong
*Assistant Examiner*—Delma R. Flores Ruis
(74) *Attorney, Agent, or Firm*—Sonnenschein, Nath & Rosenthal LLP

(57) ABSTRACT

A semiconductor laser, a semiconductor device and a nitride series III–V group compound substrate capable of obtaining a crystal growth layer with less fluctuation of the crystallographic axes and capable of improving the device characteristics, as well as a manufacturing method therefor are provided. The semiconductor laser comprises, on one surface of a substrate used for growing, a plurality of spaced apart seed crystal layers and an n-side contact layer having a lateral growing region which is grown on the basis of the plurality of seed crystal layers. The seed crystal layer is formed in that a product of width $w_1$ (unit: μm) at the boundary thereof relative to the n-side contact layer along the arranging direction A and a thickness $t_1$ (unit: μm) along the direction of laminating the n-side contact layer is 15 or less.

A semiconductor layer comprising a nitride series III–V group compound semiconductor is laminated on a substrate 11 comprising an n-type GaN. Protruded seed crystal portions are formed and a growth suppression layer having an opening corresponding to the seed crystal portion is disposed to the substrate. The semiconductor layer grows on the basis of the seed crystal portion and has a lateral growing region of low dislocation density.

18 Claims, 17 Drawing Sheets

SEMICONDUCTOR LASER, SEMICONDUCTOR DEVICE AND NITRIDE SERIES III-V GROUP COMPOUND SUBSTRATE, AS WELL AS MANUFACTURING METHOD THEREOF

RELATED APPLICATION DATA

The present application claims priority to Japanese Applications Nos. P2000-168312 filed Jun. 5, 2000, and P2000-260722 filed Aug. 30, 2000, which applications are incorporated herein by reference to the extent permitted by law.

BACKGROUND OF THE INVENTION

1. Field of the Invention

This invention concerns a semiconductor device having a seed crystal layer and a crystal growth layer grown on the basis of the seed crystal layer, a semiconductor laser and a nitride series III-V group compound substrate, as well as a manufacturing method thereof.

This invention also relates to a semiconductor laser and a semiconductor device having a substrate comprising a nitride series III-V group compound and a semiconductor layer comprising a nitride series III-V group compound grown on the basis of the substrate as well as a manufacturing method thereof.

2. Description of the Related Art

Nitride series III-V group compound semiconductors such as GaN, AlGaN mixed crystals or GaInN mixed crystals are direct transition semiconductor materials and have a feature in which the forbidden band gap ranges from 1.9 eV to 6.2 eV. Accordingly, the nitride series III-V group compound semiconductors can provide emission from a visible region to a ultraviolet region and have been noted as materials constituting semiconductor light emitting devices such as semiconductor lasers (laser diodes: LD) or light emitting diode (LED). Further, the nitride series III-V group compound semiconductors have also been noted as materials constituting electronic devices since they show high saturation electron velocity and breakdown electric field.

The semiconductor devices described above are generally produced by growing a nitride series III-V group compound semiconductor layer using a vapor deposition method on a substrate for growing comprising, for example, sapphire ($\alpha$-$Al_2O_3$) or silicon carbide (SiC). However, since lattice mismatching or difference of heat expansion coefficient is large between sapphire or silicon carbide and the nitride series III-V group compound semiconductor, lattice defects such as dislocations are formed for moderating strains in the nitride series III-V group compound semiconductor layer. When the lattice defects are formed, the defects form centers of non-light emissive recombination which do not emit light even when electrons and holes are recombined or current leak portions, to deteriorate optical or electrical characteristics of the semiconductor device.

In view of the above, a method of decreasing the penetrative dislocation density, for example, by utilizing selective growing technique has been proposed in recent years. This method is adapted to selectively etch a nitride series III-V group compound semiconductor layer grown on a substrate for growing to form a seed crystal layer and grow a crystal growth layer laterally from the side wall surface of the seed crystal layer.

Further, it has also been studied to use a substrate comprising a nitride series III-V group compound. The substrate comprising the nitride series III-V group compound is prepared by growing on a substrate for growing comprising, for example, sapphire and then separation from the substrate for growing. Since the use of the substrate comprising the nitride series III-V group compound can overcome the problems described above and obtain excellent heat conductivity compared with the sapphire substrate, it has an advantage capable of effectively dissipating heat generated during driving. Further, since an electrode can be disposed to the rear face of the substrate by adding an impurity to provide conductivity, the surface area of the device can be decreased to provide a merit of high density mounting.

However, the first method involves a problem that defects are increased by the dislocation generated in the crystal growth layer if there is fluctuation of the crystallographic axes in the crystal growth layer. Further, it has a problem that the dislocation tends to propagate while extending in the lateral direction. Accordingly, for improving device characteristics, it has been desired to grow a crystal growth layer with less fluctuation of the crystallographic axes.

Further, the second method involves a problem that the dislocation density is as high as about $1 \times 10^8$ cm$^{-2}$ to $1 \times 10^{11}$ cm$^{-2}$ since the substrate comprising the nitride series III-V group compound is prepared, for example, by growing on a substrate comprising sapphire or the like. Accordingly, the dislocation density also increases in the layer of the nitride series III-V group compound semiconductor to be grown on the substrate, failing to improve the device characteristics.

The problems described above also appear in a case of growing a nitride series III-V group compound substrate on the substrate for growing and it is indispensable to grow a crystal growth layer with less fluctuation of the crystallographic axes also for obtaining a nitride series III-V group compound substrate of good quality.

SUMMARY OF THE INVENTION

This invention has been accomplished in view of the foregoing problems and intends to provide a semiconductor laser, a semiconductor device and a nitride series III-V group compound substrate capable of obtaining a crystal growth layer with less fluctuation of the crystallographic axes and capable of improving the device characteristics, as well as a manufacturing method therefor.

This invention also intends to provide a semiconductor laser and a semiconductor device capable of decreasing the dislocation density and improving the device characteristics, as well as a manufacturing methods therefor.

A semiconductor laser according to this invention comprises a plurality of spaced apart seed crystal layers comprising a nitride series III-V group compound semiconductor and a crystal growth layer comprising a nitride series III-V group compound semiconductor which is grown on the basis of the seed crystal layer wherein the seed crystal layer is adapted in that product of a width (unit: $\mu$m) at a boundary relative to the crystal growth layer along the arranging direction and a thickness (unit $\mu$m) in the laminating direction of the crystal growth layer is 15 or less.

Another semiconductor laser according to this invention comprises band-like seed crystal layers comprising a nitride series III-V group compound semiconductor and a crystal growth layer comprising a nitride series III-V group compound semiconductor which is grown on the basis of the seed crystal layer wherein the seed crystal layer is adapted in that a product of a width (unit: $\mu$m) at a boundary relative to the crystal growth layer along the direction perpendicular to the extending direction and a thickness (unit μm) in the laminating direction of the crystal growth layer is 15 or less.

A semiconductor device according to this invention comprises a plurality of spaced apart seed crystal layers comprising a nitride series III–V group compound semiconductor and a crystal growth layer comprising a nitride series III–V group compound semiconductor which is grown on the basis of the seed crystal layer wherein the seed crystal layer is adapted in that product of a width (unit: μm) at a boundary relative to the crystal growth layer along the arranging direction and a thickness (unit μm) in the laminating direction of the crystal growth layer is 15 or less.

Another semiconductor device according to this invention comprises band-like seed crystal layers comprising a nitride series III–V group compound semiconductor and a crystal growth layer comprising a nitride series III–V group compound semiconductor which is grown on the basis of the seed crystal layer wherein the seed crystal layer is adapted in that a product of a width (unit: μm) at a boundary relative to the crystal growth layer along the direction perpendicular to the extending direction and a thickness (unit μm) in the laminating direction of the crystal growth layer is 15 or less.

A nitride series III–V group compound substrate according to this invention comprises a plurality of spaced apart seed crystal layers comprising a nitride series III–V group compound semiconductor and a crystal growth layer comprising a nitride series III–V group compound semiconductor which is grown on the basis of the seed crystal layer wherein the seed crystal layer is adapted in that product of a width (unit: μm) at a boundary relative to the crystal growth layer along the arranging direction and a thickness (unit μm) in the laminating direction of the crystal growth layer is 15 or less.

A method of manufacturing a semiconductor laser according to this invention includes a step of growing a growth layer for seed crystal layer comprising a nitride series III–V group compound semiconductor on a substrate used for growing, a step of selectively removing the growth layer for seed crystal layer to form a plurality of seed crystal layers and forming them in that a product between a width (unit: μm) at the upper surface on the growing side along the arranging direction thereof and a thickness (unit: μm) along the growing direction is 15 or less and a step of growing a crystal growth layer comprising a nitride series III–V group compound semiconductor on the basis of the seed crystal layer.

A method of manufacturing a semiconductor device according to this invention includes a step of growing a growth layer for seed crystal layer comprising a nitride series III–V group compound semiconductor on a substrate used for growing, a step of selectively removing the growth layer for seed crystal layer to form a plurality of seed crystal layers and forming them in that a product between a width (unit: μm) at the upper surface on the growing side along the arranging direction thereof and a thickness (unit: μm) along the growing direction is 15 or less and a step of growing a crystal growth layer comprising a nitride series III–V group compound semiconductor on the basis of the seed crystal layer.

A method of manufacturing a nitride series III–V group a compound substrate according to this invention includes a step of growing a growth layer for seed crystal layer comprising a nitride series III–V group compound semiconductor on a substrate used for growing, a step of selectively removing the growth layer for seed crystal layer to form a plurality of seed crystal layers and forming them in that a product between a width (unit: μm) at the upper surface on the growing side along the arranging direction thereof and a thickness (unit: μm) along the growing direction is 15 or less and a step of growing a crystal growth layer comprising a nitride series III–V group compound semiconductor on the basis of the seed crystal layer.

In the semiconductor laser, the semiconductor device or the nitride series III–V group compound semiconductor substrate according to this invention, the seed crystal layer is adapted in that the product of the width (unit: μm) at the boundary of the seed crystal layer relative to the crystal growth layer along the direction of the arrangement thereof and a thickness (unit: μm) along the direction of laminating the crystal growth layer is 15 or less. Accordingly, fluctuation of the crystallographic axes of the crystal growth layer is decreased.

In another semiconductor laser or another semiconductor device according to this invention, the seed crystal layer is adapted in that the product of the width (unit: μm) at the boundary of the seed crystal layer relative to the crystal growth layer along the direction perpendicular to the extending direction thereof and a thickness (unit: μm) along the direction of laminating the crystal growth layer is 15 or less. Accordingly, fluctuation of the crystallographic axes in the crystal growth layer is decreased.

In the method of manufacturing the semiconductor laser, the method of manufacturing the semiconductor device or the method of manufacturing the nitride series III–V group compound substrate according to this invention, the crystal growth layer is grown on the basis of a plurality of seed crystal layers formed in that a product of the width (unit: μm) at the upper surface on the growing side along the direction of arrangement and a thickness (unit: μm) along the growing direction is 15 or less. Accordingly, fluctuation of the crystallographic axes in the crystal growth layer is decreased.

A semiconductor laser according to this invention comprises a substrate comprising a nitride series III–V group compound and having protruded seed crystal portions, a semiconductor layer comprising a nitride series III–V group compound semiconductor, growing on the basis of the seed crystal portions and laminated to the substrate, and a growth suppression layer disposed between the substrate and the semiconductor layer and having an opening corresponding to the seed crystal portions.

A semiconductor device according to this invention comprises a substrate comprising a nitride series III–V group compound and having protruded seed crystal portions, a semiconductor layer comprising a nitride series III–V group compound semiconductor, growing on the basis of the seed crystal portions and laminated to the substrate, and a growth suppression layer disposed between the substrate and the semiconductor layer and having an opening corresponding to the seed crystal portions.

A method of manufacturing a semiconductor laser according to this invention comprises a step of forming a plurality of protruded seed crystal portions being spaced from each other to a substrate comprising a nitride series III–V group compound, a step of forming a growth suppression layer having an opening corresponding to the seed crystal portion on the substrate and a step of growing a semiconductor layer comprising a nitride series III–V group compound semiconductor on the basis of the seed crystal portion.

A method of manufacturing a semiconductor device according to this invention comprises a step of forming a plurality of protruded seed crystal portions being spaced from each other to a substrate comprising a nitride series III–V group compound, a step of forming a growth suppression layer having an opening corresponding to the seed crystal portion on the substrate and a step of growing a semiconductor layer comprising a nitride series III–V group compound semiconductor on the basis of the seed crystal portion.

In the semiconductor laser and the semiconductor device according to this invention, since the semiconductor layer is grown on the basis of the seed crystal portions of the substrate, dislocation density in the semiconductor layer is decreased.

In the method of manufacturing the semiconductor laser or the method of manufacturing the semiconductor device according to this invention, since a plurality of seed crystal portions are formed being spaced apart from each other to the substrate and the growth suppression layer having an opening corresponding to the seed crystal portion is formed and then the semiconductor layer is grown on the basis of the seed crystal portion. Accordingly, a semiconductor layer with low dislocation density can be obtained.

DESCRIPTION OF ACCOMPANYING DRAWINGS

DESCRIPTION OF PREFERRED EMBODIMENT

This invention is to be described specifically by way of preferred embodiments with reference to the drawings.
[First Embodiment]

Figure 1:
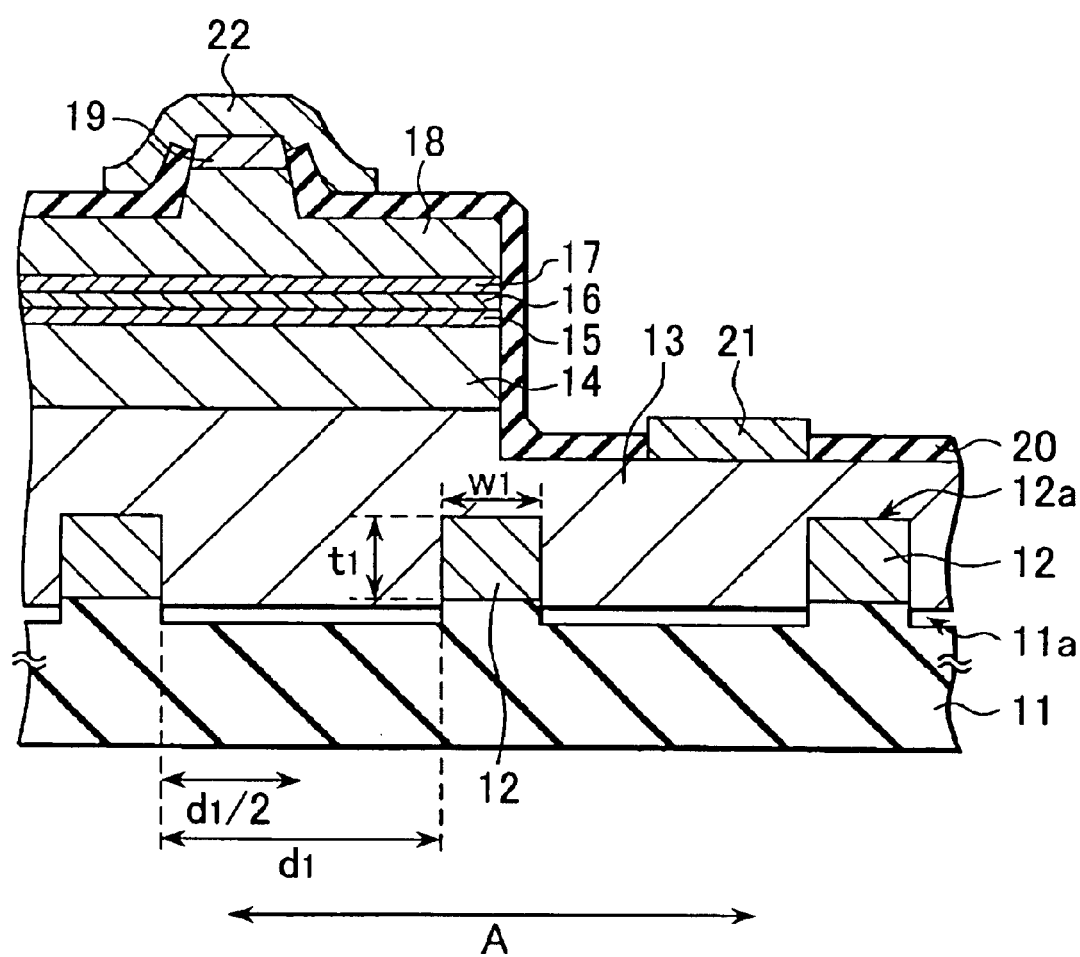
FIG. 1 is a cross sectional view illustrating the constitution of a semiconductor device according to a first embodiment of this invention.

FIG. 1 illustrates a cross sectional structure of a semiconductor laser as a semiconductor device according to a first embodiment of this invention.

The semiconductor laser comprises, on one surface of a substrate 11 used for growing, a plurality of seed crystal layers 12 disposed being spaced apart from each other, an n-side contact layer 13, an n-type clad layer 14, an n-type guide layer 15, an active layer 16, a p-type guide layer 17, a p-type clad layer 18 and a p-side contact layer 19 laminated in this order as a crystal growth layer grown successively on the basis of the plurality of the seed crystal layers 12.

Each of the seed crystal layer 12, the n-side contact layer 13, n-type clad layer 14, n-type guide layer 15, the active layer 16, the p-type guide layer 17, the p-type clad layer 18 and the p-side contact layer 19 is constituted with a nitride series III–V group compound semiconductor respectively. The nitride series III–V group compound semiconductor means a compound semiconductor containing at least one of group IIIb elements and at least nitrogen among group Vb elements.

The substrate 11 used for growing comprises, for example, sapphire or silicon carbide having a thickness in the laminating direction (hereinafter simply referred to as thickness) of 80 $\mu$m, and the seed crystal layer 12 and the like are formed, for example, on the c-face of the substrate 11 used for growing. The substrate 11 has a concave portion 11a, for example, corresponding to a spacing region for the seed crystal layer 12. The thickness in the laminating direction of the concave portion 11a is preferably 20 $\mu$m or more, because this can effectively prevent contact of the n-side contact layer 13 from the substrate 11 upon growing the n-side contact layer 13 on the basis of the seed crystal layer 12. Further, the thickness of the concave portion 11a is more preferably 300 $\mu$m or less, because unnecessary etching increases the manufacturing cost.

The seed crystal layer 12 comprises, for example, undoped-GaN with no addition of an impurity or n-type GaN with addition of silicon (Si) as an n-type impurity. Each of the seed crystal layers 12 is formed, for example, as a band-like shape and they are arranged in a stripe pattern. Further, the seed crystal layer 12 is formed in that a product of a width $w_1$ (unit: $\mu$m) at a boundary 12a relative to the n-side contact layer 13 in the direction of arranging them (arranging direction A) (for example, a direction perpendicular to the extending direction of the band) and a thickness $t_1$ (unit: $\mu$m) in the direction of laminating the n-side contact layer 13 is 15 or less.

This is for decreasing fluctuation of the crystallographic axes in the n-side contact layer 13 to improve the crystallinity of the n-side contact layer 13. Specifically, fluctuation of the crystallographic axes, for example, along the arranging direction A of the seed crystal layer 12 is decreased. Also, the product of the width $w_1$ ($\mu$m) and the thickness $t_1$ ($\mu$m) of the seed crystal layer is preferably 2.25 or more. Further, if the width $w_1$ is narrower than 1.5 $\mu$m, the seed crystal layer 12 tends to be defoliated from the substrate 11 used for growing, for example, during manufacture and, if the thickness is less than 1.5 $\mu$m, the crystallinity of the seed crystal layer 12 is deteriorated as will be described later. The product of the width $w_1$ ($\mu$m) and the thickness $t_1$ ($\mu$m) of the seed crystal layer is preferably 10 or less and, more preferably, 8 or less and, further preferably, 6 or less, because this can further decrease the fluctuation of the crystallographic axes in the n-side contact layer 13.

Figure 2:
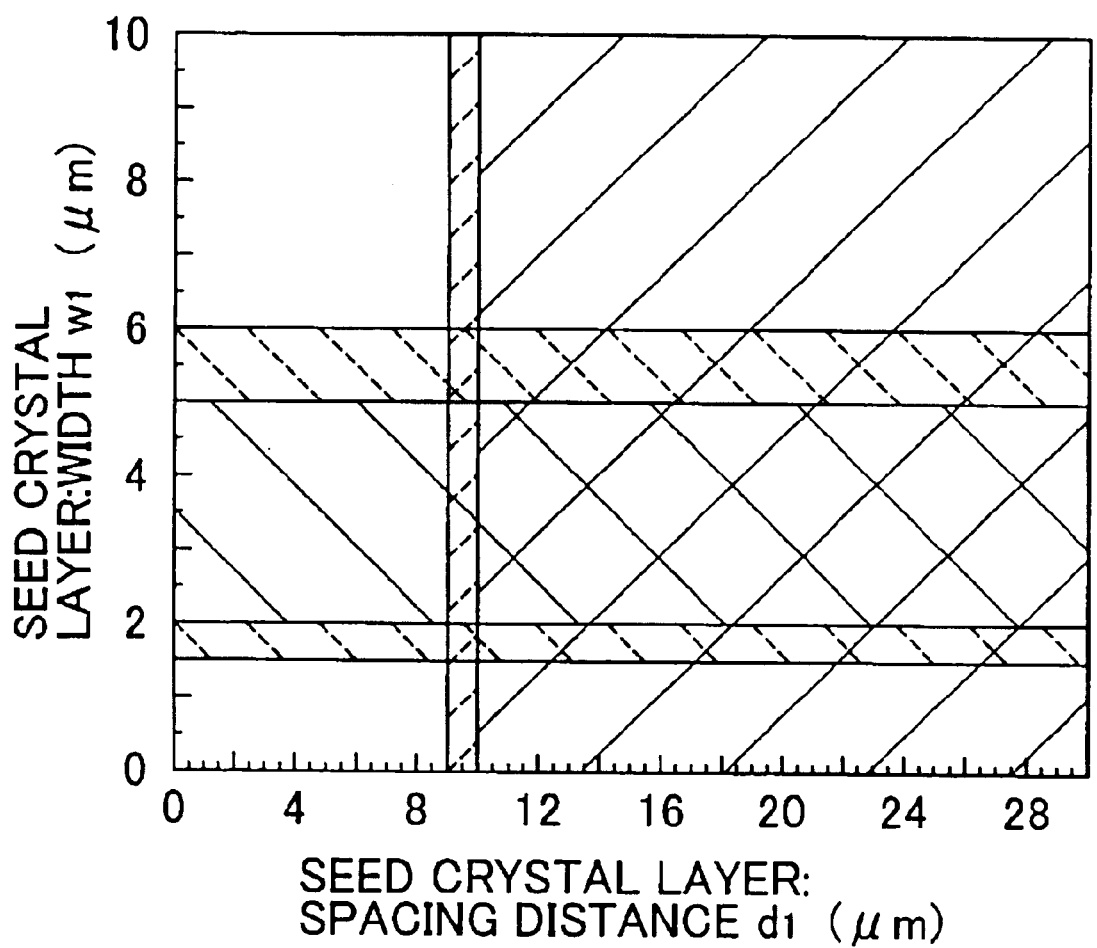
FIG. 2 is an explanatory view for explaining a seed crystal layer shown in FIG. 1.

FIG. 2 shows a preferred range for the width $w_1$ of the boundary 12a of the seed crystal layer 12 relative to the n-side contact layer 13 along the arranging direction A and the spacing distance $d_1$ for the seed crystal layer 12 along the arranging direction A. The width $w_1$ for seed crystal layer 12 is preferably within a range shown by rightwardly descending hatched lines, that is, from 1.5 $\mu$m to 6 $\mu$m in FIG. 2. It is further preferably within a range shown by solid lines, that is, within a range of 2 $\mu$m or more and 5 $\mu$m or less. If the width $w_1$ is narrow, the n-side contact layer 13 tends to be defoliated during manufacture, whereas if the width $w_1$ is wide, fluctuation of the crystallographic axes tends to be formed in the n-side contact layer 13. The spacing distance $d_1$ for the seed crystal layer is preferably within a range shown by the leftwardly descending hatched lines, that is, 9 $\mu$m or more in FIG. 2 and it is further preferably within a range shown by the solid lines, that is, 10 $\mu$m or more. If the spacing distance $d_1$ is shorter, a process margin is narrowed, for example, upon mask alignment during manufacture to lower the productivity.

Figure 3:
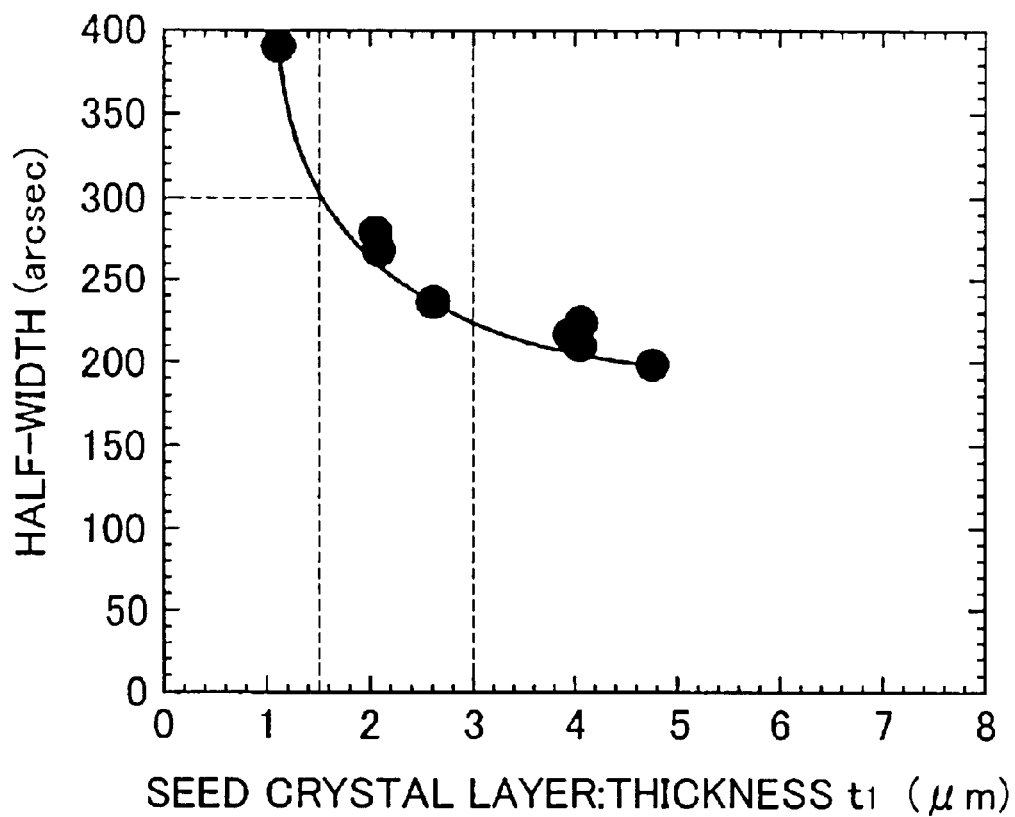
FIG. 3 is another explanatory view for explaining a seed crystal layer shown in FIG. 1.

FIG. 3 shows a relation between the thickness $t_1$ of the seed crystal layer 12 and the half-width of a rocking curve by X-diffraction (XRD) for the seed crystal layer 12 obtained upon incidence of X-rays from the side of the boundary 12a. As shown in the graph, the half-width is narrower as the thickness $t_1$ of the seed crystal layer 12 increases to decrease the fluctuation of the crystallographic axes. The half-width of the rocking curve by XRD is narrower as the fluctuation of the crystallographic axes is decreased and this constitutes an index for the crystallinity.

As the crystallinity of the seed crystal layer 12, it is preferred that the fluctuation of the crystallographic axes is small to such an extent that the half-width in the boundary 12a is, for example, 300 arcsec or less. This is because the fluctuation for the crystallographic axes in the n-side contact layer 13 can be decreased more as the crystallinity of the seed crystal layer 12 is higher. Accordingly, the thickness to of the seed crystal layer 12 is preferably 1.5 $\mu$m or more for instance. Further, the thickness $t_1$ of the seed crystal layer is preferably 3 $\mu$m or less. If the thickness is more than 3 $\mu$m, when the n-side contact layer 13 is grown during manufacture to be described later, the thickness required to flatten the grown surface is increased and, as a result, warp is caused to the substrate 11 used for growing.

Figure 4:
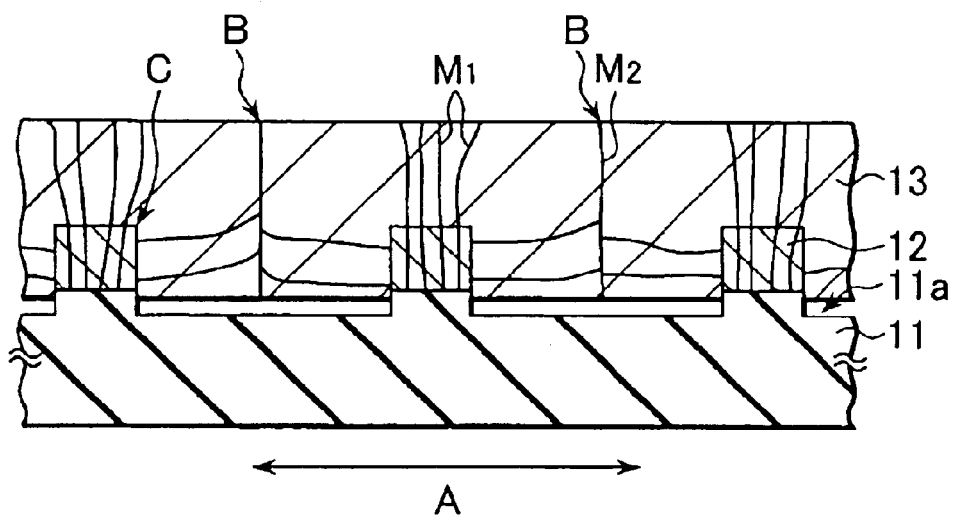
FIG. 4 is a schematic view illustrating a state of generation of penetrative dislocation in an n-side contact layer shown in FIG. 1.

The n-side contact layer 13 has a thickness, for example, of 3 $\mu$m and comprises n-type GaN with addition of silicon as an n-type impurity. The n-side contact layer 13 has a lateral growing region grown along the arranging direction A (lateral direction) on the basis of the side wall surface of the seed crystal layer 12. As shown in FIG. 4, penetrative dislocation from the seed crystal layer 12 less propagates and the dislocation density is lowered in the lateral growing region. Accordingly, also for the semiconductor layer from the n-type clad layer 14 to the p-side contact layer 19 laminated on the n-side contact layer 13, the dislocation density at a portion corresponding to the lateral growing region is as low as, for example, $10^6$ cm$^{-2}$ or less. On the contrary, penetrative dislocation $M_1$ from the seed crystal layer 12 propagates in the region of the n-side contact layer 13 corresponding to the seed crystal layer 12. Further, n-side contact layer 13 has an associated portion B formed by association between crystals growing in the lateral direction about at a central portion of the lateral growing region, and penetrative dislocation $M_2$ generated by the association exists in the associated portion B. The penetrative dislocation $M_2$ often propagates to the semiconductor layers including from the n-type clad layer 14 to the p-side contact layer 19 laminated on the n-side contact layer 13.

The n-type clad layer 14 has a thickness, for example, of 1 $\mu$m and comprises n-type AlGaN mixed crystals with addition of silicon as an n-type impurity. The n-type guide layer 15 has a thickness, for example, of 0.1 $\mu$m and comprises n-type GaN with addition of silicon as an n-type impurity.

The active layer has a thickness, for example, of 30 nm and has a multiple quantum well structure formed by laminating $Ga_xIn_{1-x}N$ (where $x \geq 0$) of different compositions. The active layer 16 has an injection region to which a current is injected and the injection region functions as a light emitting region.

The p-type guide layer 17 has a thickness, for example, of 0.1 $\mu$m and comprises p-type GaN with addition of magnesium (Mg) as a p-type impurity. The p-type clad layer 18 has a thickness, for example, of 0.8 $\mu$m and comprises p-type AlGaN mixed crystals with addition of magnesium as a p-type impurity. The p-side contact layer 19 has a thickness, for example, of 0.5 $\mu$m and comprises p-type GaN with addition of magnesium as a p-type impurity. The p-side contact layer 19 and a portion of the p-type clad layer 18 are shaped each into a fine stripe shape (a band extended in the direction perpendicular to the drawing of FIG. 1), which constitute a current restriction portion.

The current restriction portion is for the restriction of the injection region to which current is injected to the active layer 16 and a portion of the active layer 16 corresponding to the current restriction portion forms an injection region as a light emitting region. Accordingly, for preventing degradation and improving characteristics of the device, it is preferred that the injection region (that is, the current restriction portion) is formed corresponding to the lateral growing direction of low dislocation density. However, since the penetrative dislocation $M_2$ exists at the associated portion B of crystals (refer to FIG. 4), it is more preferred that the injection region is disposed corresponding to the region between the seed crystal layer 12 and the associated portion B.

Figure 5:
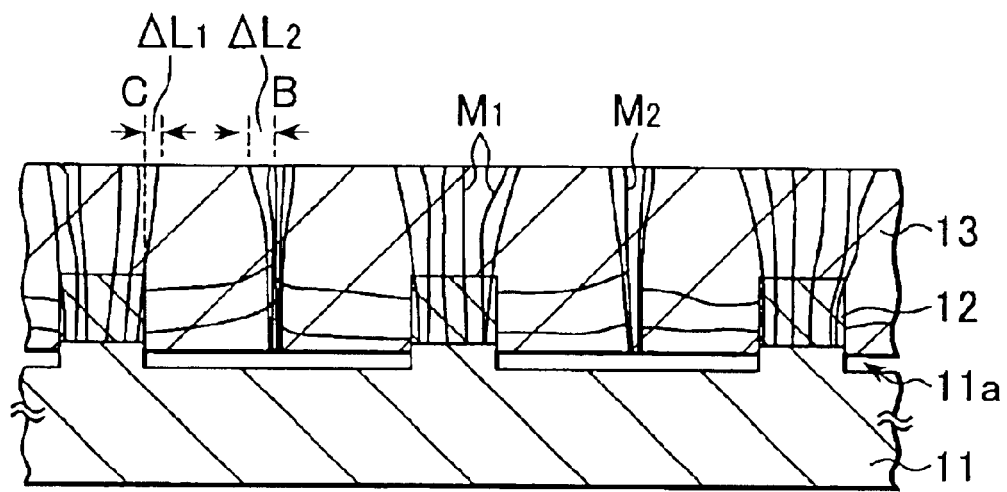
FIG. 5 is a schematic view illustrating another state of generation of penetrative dislocation in an n-side contact layer shown in FIG. 1.

As shown in FIG. 5, as the thickness of the semiconductor layer from the n-side contact layer 13 to the p-side contact layer 19 increases, the penetrative dislocation $M_1$ tends to propagate while extending by $\Delta L_1$ from the end C along the arranging direction A at the boundary 12a of the seed crystal layer 12 on the side of the active layer 16 and the penetrative dislocation $M_2$ tends to propagate while extending by $\Delta L_2$ from the associated portion B of the crystals grown laterally along the arranging direction A. Accordingly, penetrative dislocations $M_1$, $M_2$ may possibly propagate in the vicinity of the seed crystal layer 12 and the associated portion B. Therefore, for lowering the possibility that the penetrative dislocations $M_1$, $M_2$ intrude to the light emitting region and obtaining satisfactory device characteristics, it is preferred to dispose the injection region in a region to be described later.

Figure 6:
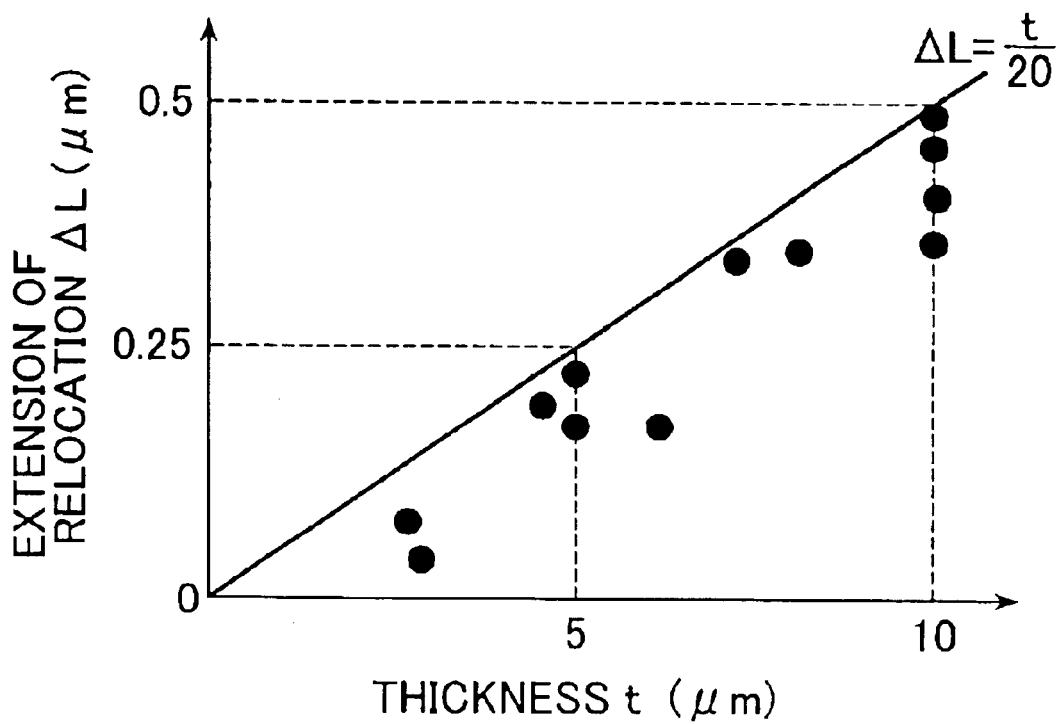
FIG. 6 is a characteristic graph expressing a relation between a thickness of crystals and an extension of dislocation.
Figure 7:
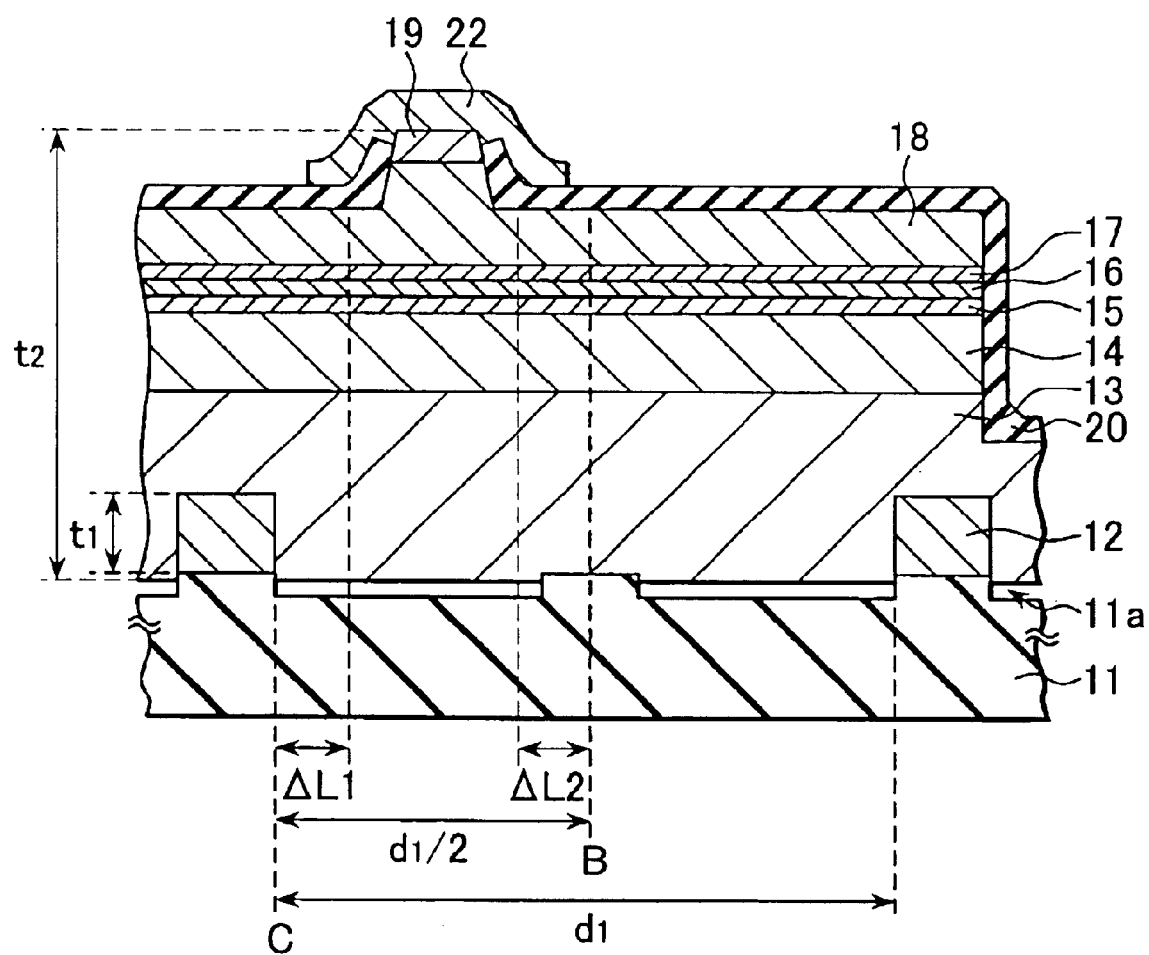
FIG. 7 is another cross sectional view illustrating the constitution of a semiconductor device according to a first embodiment of this invention.

FIG. 6 shows a relation between a thickness $t$ of a nitride series III–V group compound semiconductor layer and an extension $\Delta L$ of penetrative dislocation. As shown in the figure, the thickness $t$ and the extension $\Delta L$ of the penetrative dislocation are in a proportional relation. Specifically, the relation is expressed, for example, as: $\Delta L = t/20$, and the extension $L_1$ of the penetrative dislocation $M_1$ can be approximated as: $\Delta L_1 = (t_2 - t_1)/20$ where $t_1$ represents the thickness of the seed crystal layer 12 in the direction of laminating the n-side contact layer 13 and $t_2$ is the sum for the thickness of the n-side contact layer 13, the n-type clad layer 14, the n-type guide layer 15, the active layer 16, the p-type guide layer 17, the p-type clad layer 18 and the p-side contact layer 19 in the spacing region for the seed crystal layer 12. Further, the extension $\Delta L_2$ of the penetrative dislocation $M_2$ is expressed as $\Delta L_2 = t_2/20$. Accordingly, the injection region may be disposed corresponding to the inside of a region spaced apart by $\Delta L_1 = (t_2 - t_1)/20$ ($\mu$m) or more from the end C of the seed crystal layer 12 at the boundary 12a on the side of the active layer along the arranging direction A and also spaced apart by $\Delta L_2 = t_2/20$ ($\mu$m) or more from the associated portion B along the arranging direction A as shown in FIG. 7. By the way, in a case where $t_2$ is 7 $\mu$m and $t_1$ is 2 $\mu$m, $\Delta L_1 = 0.25$ $\mu$m and $\Delta L_2 = 0.35$ $\mu$m.

Further, it is preferred that the injection region is formed corresponding to the inside of a region being spaced by 0.93 $\mu$m or more both for the distance from the end C at the boundary 12a of the seed crystal layer 12 on the side of the active layer 16 along the arranging direction A and for the distance from the associated portion B along the arranging direction A, since the device characteristics can be improved further. Since the diffusion length of the minority carriers in the GaN crystals is 0.93 $\mu$m and it is considered that the nitrogen series III–V group compound semiconductor used herein also has the same extent of diffusion length in crystals, the dislocation density can be lowered also for the diffusion region where the minority carriers are diffused from the injection region. It is further preferred that the light emitting region is disposed in a region spaced apart by $\Delta L_1 + 0.93$ ($\mu$m) or more from the seed crystal layer 12 along the arranging direction A and spaced apart by $\Delta L_2 + 0.93$ ($\mu$m) or more from the associated portion B along the arranging direction A, since the dislocation density can be further lowered in the diffusion region.

In the semiconductor laser, the width of the n-side contact layer 13 along the arranging direction A is larger than the width of the n-type clad layer 14, the n-type guide layer 15, the active layer 16, the p-type guide layer 17, the p-type clad layer 18, and the p-side contact layer 19, and the n-type clad layer 14, the n-type guide layer 15, the active layer 16, the p-type guide layer 17, the p-type clad layer 18, and the p-side contact layer 19 are laminated on a portion of the n-side contact layer 13.

An insulator 20 comprising, for example, silicon dioxide ($SiO_2$) is formed on the surface of the n-side contact layer 13 to the p-side contact layer 19. Openings are formed to the insulator 20 corresponding to the n-side contact layer 13 and the p-side contact layer 19 respectively, and an n-side electrode 21 and a p-side electrode 22 are formed corresponding to the openings on the n-side contact layer 13 and the p-side contact layer 19 respectively. The n-side electrode 21 has a structure formed, for example, by successively laminating titanium (Ti) and aluminum (Al) and alloying them by a heat treatment, which is electrically connected with the n-side contact layer 13. The p-side electrode 22 has a structure formed, for example, by laminating palladium (Pd), platinum (Pt) and gold (Au) successively, which is electrically connected with the p-side contact layer 19.

Further, in the semiconductor laser, a pair of lateral sides of the p-side contact layer 19 opposed in the longitudinal direction constitute resonator end faces and a pair of reflector membranes are formed respectively (not illustrated) to the pair of resonator end faces. Among the pair of reflector membranes, the reflectivity is controlled in that one of the membranes has a low reflectivity while the other has a high reflectivity. In this structure, light generated in the active layer 16 is a amplified while being reciprocated between the pair of reflector membranes and then emitted as a laser beam from the reflector membrane at low reflectivity.

The semiconductor laser can be manufactured, for example, as described below.

Figure 8A:
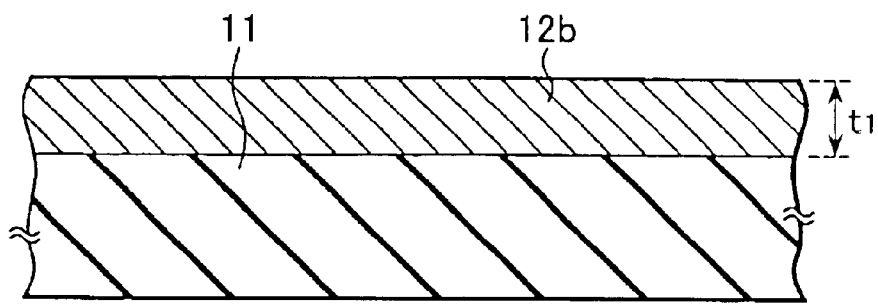
FIG. 8 is a cross sectional view for explaining a method of manufacturing the semiconductor device shown in FIG. 1.

At first, as shown in FIG. 8A a substrate 11 used for growing comprising, for example, sapphire or silicon carbide of 400 $\mu$m thickness is prepared. Then, on the substrate 11 used for growing (for example on the c face in a case of substrate 11 comprising sapphire), crystals of undoped GaN or n-type GaN are grown, for example by an MOCVD (Metal Organic Chemical Vapor Deposition) method to a predetermined value of thickness $t_1$ in the growing direction of crystals of undope GaN or n-type GaN of about 1.5 $\mu$m–3 $\mu$m, to form a growth layer 12b for seed crystal layer for forming a seed crystal layer 12. In a case of growing the growth layer 12b for the seed crystal layer by the MOCVD method, it can be conducted in any of atmospheres including normal pressure atmosphere, reduced pressure atmosphere, or pressurized atmosphere (for example, within a range from $1.33 \times 10^4$ Pa to $1.2 \times 10^5$ Pa). It is preferably conducted in the pressurized atmosphere for obtaining crystal at high quality with less fluctuation of the crystallographic axes.

Figure 8B:
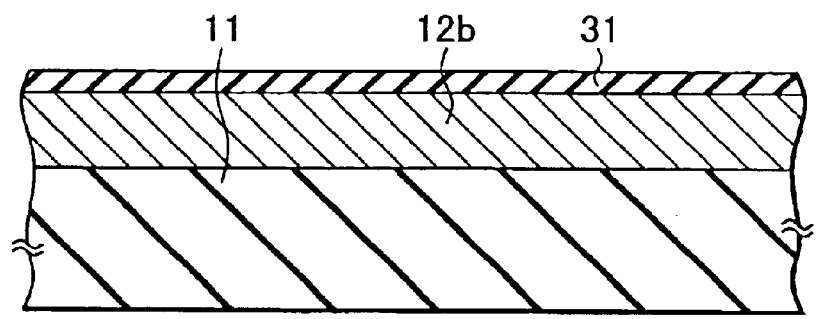

Then, as shown in FIG. 8B, an insulator 31 comprising silicon nitride ($Si_3N_4$), silicon dioxide ($SiO_2$) of 0.3 $\mu$m to 1 $\mu$m thickness is formed, for example, by a CVD (Chemical Vapor Deposition) method. The insulator 31 may be a laminate structure, for example, of a silicon nitride film and a silicon dioxide film.

Figure 8C:
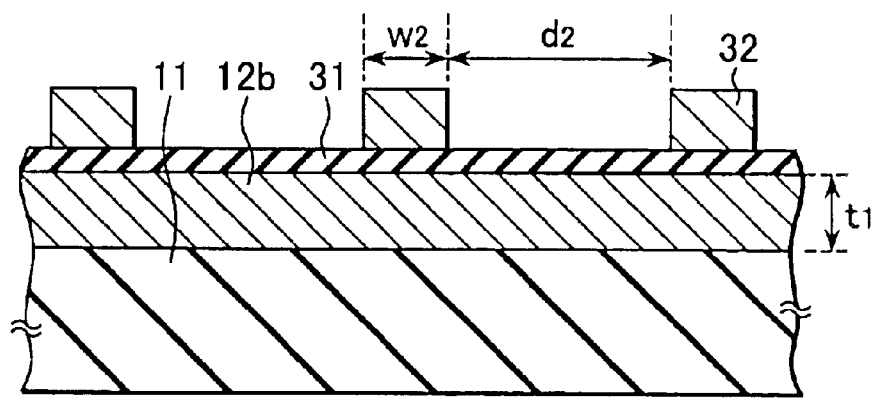

Subsequently, as shown in FIG. 8C, a photoresist film 32, for example, of 2 $\mu$m to 5 $\mu$m thickness is formed on the insulator 31 and a pattern comprising a plurality of stripes of the growth layer 12b for seed crystal layer extended in the direction shown by the following indication is formed:

<1$\bar{1}$00>

The photoresist film 32 and the insulator 31 are used for selectively etching the growth layer 12a for seed crystal layer thereby forming the seed crystal layer 12.

When the pattern for the photoresist film 32 is formed, it is formed in that a product of a thickness $t_1$ ($\mu$m) in the growing direction of the growth layer 12 for seed crystal layer and a width $w_2$ ($\mu$m) along the arranging direction of the photoresist film 32 is 15 or less, preferably, 10 or less, more preferably, 8 or less and, further preferably, 6 or less. Further, it is preferred that the product of the thickness $t_1$ ($\mu$m) and the width $w_2$ ($\mu$m) is greater than 2.25. Further, the spacing distance $d_2$ along the arranging direction of the photoresist film 32 is preferably 9 $\mu$m or more.

Figure 9A:
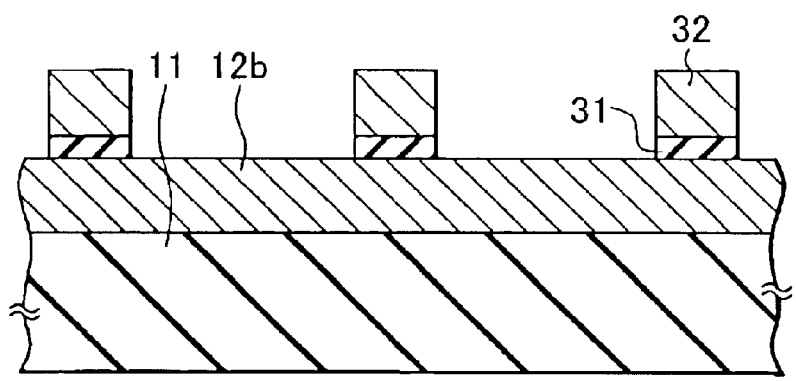
FIG. 9 is a cross sectional view for explaining manufacturing steps succeeding to FIG. 8.
Figure 9B:
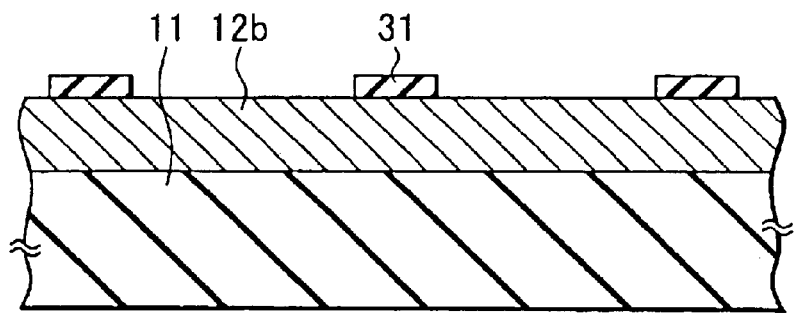

After forming the pattern of the photoresist film 32, RIE (Reactive Ion Etching) is applied for instance, using the photoresist film 32 as a mask to selectively remove a portion of the insulator 31 not covered with the photoresist film 32 as shown in FIG. 9A. Then, as shown in FIG. 9B, the photoresist film 32 is removed.

Figure 9C:
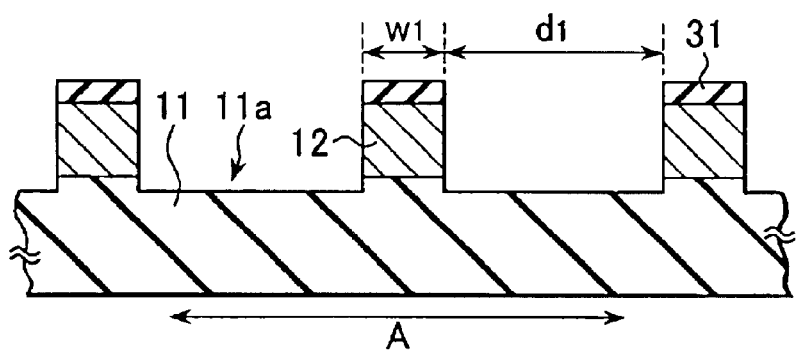

After removing the photoresist film 32, RIE is conducted by using, for example, a chlorine gas ($Cl_2$) as an etching gas while using the insulator 31 as a mask, and a portion of the growth layer 12b for seed crystal layer not covered with the insulator 31 is selectively removed to form, for example, a plurality of spaced stripe-like seed crystal layers 12 as shown in FIG. 9C. Since the seed crystal layer 12 is formed corresponding to the pattern of the photoresist film 32, the product of the width $w_1$ ($\mu$m) for the upper surface on the growing side of the seed crystal layer 12 along the arranging direction A and the thickness $t_1$ ($\mu$m) of the seed crystal layer 12 is 15 or less, preferably, 10 or less, more preferably, 8 or less, further preferably, 6 $\mu$m or less and, desirably, takes a value greater than 2.25. Further, the spacing distance $d_1$ between the seed crystal layers 12 is preferably 9 $\mu$m or more.

Then, RIE is applied for instance by using the insulator 31 as a mask to remove a portion of the substrate 11 used for growing not covered with the insulator 31 selectively. Specifically, it is conducted by using a chlorine gas as an etching gas and under the conditions at a substrate temperature of 0° C. and a pressure of 0.5 Pa. By the procedures described above, a concave portion 11a is formed to the substrate 11 used for growing corresponding to the removable region in the growth layer 12b for seed crystal layer (that is, spacing region between the seed crystal layers 12). Etching for the substrate 11 can be conducted continuously with etching for the growth layer 12b for seed crystal, or can be conducted as a separate step.

Figure 9D:
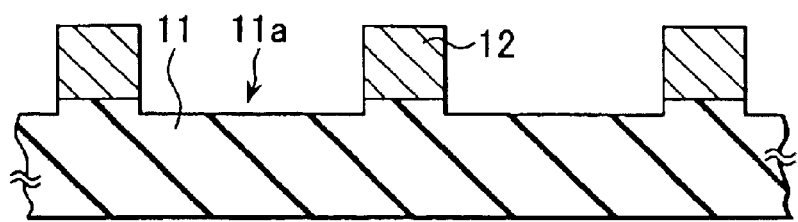

After forming the concave portion 11a to the substrate 11, the insulator 31 is removed by conducting, for example, etching using an aqueous solution containing hydrogen fluoride (HF) as an etching agent as shown in FIG. 9D.

Figure 10:
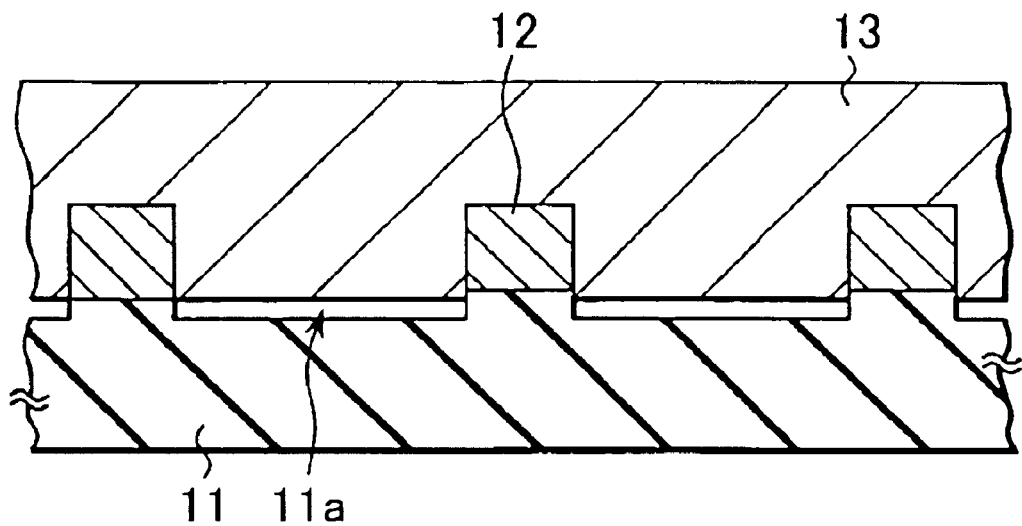
FIG. 10 is a cross sectional view for explaining manufacturing steps succeeding to FIG. 9.

Successively, as shown in FIG. 10, an n-side contact layer 13 is formed by growing crystals of n-type GaN to about 4 $\mu$m on the basis of the seed crystal 12, for example, by an MOCVD method. In this case, crystal growth of the n-type GaN proceeds mainly from the upper surface and the lateral wall surfaces of the seed crystal layer 12 and also proceeds in the lateral direction. The growing rate of the seed crystal layer 12 from the side wall surface is higher than the growing rate from the upper surface and crystals of the n-type GaN grown from the side wall surface extend after lapse of a predetermined time to make the grown surface substantially flat.

In the n-side contact layer 13, while the penetrative dislocation $M_1$ (refer to FIG. 4) propagates in the region above the seed crystal layer 12, since the penetrative dislocation $M_1$ from the seed crystal layer 12 deflects laterally in other portions corresponding to the lateral growing region, such penetrative dislocation scarcely exists. That is, the penetrative dislocation density in the n-side contact layer 13 can be decreased by growing the n-side contact layer 13 on the basis of the seed crystal layer 12.

Further, since the product of the width $w_1$ ($\mu$m) and the thickness $t_1$ ($\mu$m) of the seed crystal layer 12 is 15 or less, fluctuation of the crystallographic axes in the n-side contact layer 13 is also decreased. When the product of the width $w_1$ ($\mu$m) and the thickness $t_1$ ($\mu$m) of the seed crystal layer of 10 or less, 8 or less and further, 6 $\mu$m or less, fluctuation of the crystallographic axes in the n-side contact layer 13 is further decreased. Further, when the product between the width $w_1$ ($\mu$m) and the thickness $t_1$ ($\mu$m) of the seed crystal layer 12 is larger than 2.25, defoliation of the seed crystal layer 12 from the substrate 11 used for growing can be prevented.

When the n-side contact layer 13 is grown, it is preferred that the growing rate is restricted to 6 $\mu$m/h or lower. If it is grown at a rate higher than 6 $\mu$m/h, fluctuation of the crystallographic axes of the n-side contact layer 13 increases and crystals laterally growing on the basis of the seed crystal layer 12 are associated to each other to result in disdvantages that it takes a long time till the grown surface of the n-side contact layer 13 is flattened or no flat grown surface can be obtained. Further, the growing rate is preferably 4 $\mu$m/h or less and, further preferably, 2 $\mu$m/h or more. This is because the fluctuation of the crystallographic axes is further decreased to obtain preferred crystals at 4 $\mu$m/h or less, but the surfaces is roughened if it is lower than 2 $\mu$m/h.

Further, since the concave portion 11a is disposed in the substrate 11 used for growing, this can prevent the n-side contact layer 13 from contact with the substrate 11 to cause defects and occurrence of fluctuation of the crystallographic axes in the lateral growing region. When the concave portion 11a is not formed in the substrate 11, it may be a worry that the crystals grown in the lateral direction are not associated to each other and no substantially flat surface can be obtained. The seed crystal layer 12 may sometimes grow not just laterally but may proceed somewhat toward the substrate 11. However, when the depth of the concave portion 11a in the substrate 11 is 20 nm to 300 nm, contact between the n-side contact layer 13 and the substrate 11 can be prevented effectively.

After forming the n-side contact layer 13, an n-type clad layer 14, and an n-type guide layer 15 comprising an n-type GaN, an active layer 16 comprising mixed crystals of undoped GaInN with addition of an impurity, a p-type guide layer 17 comprising a p-type GaN, a p-type clad layer 18 comprising a p-type AlGaN mixed crystals and a p-side contact layer 19 comprising p-type GaN are grown successively on the n-side contact layer 13.

MOCVD is conducted by using, for example, trimethyl gallium (($CH_3$)$_3$Ga) as a starting material gas for gallium, trimethyl aluminum (($CH_3$)$_3$Al) as a starting material gas for aluminum, trimethyl indium (($CH_3$)$_3$In) as a starting material gas for indium and ammonia ($NH_3$) as a starting material gas for nitrogen, respectively, and further, monosilane ($SiH_4$) as a starting material gas for silicon and bicyclopentadienyl magnesium (($C_5H_5$)$_2$Mg) as a starting material gas for magnesium.

After growing the p-side contact layer 19, the p-side contact layer 19, the p-type clad layer 18, the p-type guide layer 17, the active layer 16, the n-type guide layer 16, the n-type clad layer 14 and a portion of the n-type contact layer 13 are etched successively to expose the n-side contact layer 13 to the surface. Successively, a mask (not illustrated) is formed on the p-side contact layer 19 and the p-side contact layer 19 and a portion of the p-type clad layer 18 are selectively etched to form the upper portion of the p-type clad layer 18 and the p-side contact layer 19 each into a fine band shape, for example, of about 2.5 $\mu$m width, to form a current restriction portion.

In this case, since the penetrative dislocation $M_2$ exists at the associated portion B situated at the center along the arranging direction A in the spacing region of the seed crystal layer 12 (refer to FIG. 4), it is more preferred to dispose the current restricted portion corresponding to a region between the seed crystal layer 12 and the center of the spacing region thereof along the arranging direction to form the injection region of the active layer 16 in this region. Further, it is more preferred to dispose the current restriction portion, that is, the injection region for the active layer 16 in the inside of the region with the distance from the end C at the upper surface on the growing side of the seed crystal layer 12 along the arranging direction A of: $\Delta L_1=(t_2-t_1)/20$ ($\mu$m) and the distance from the center of the spacing direction of the seed crystal layer 12 along the arranging direction A of: $\Delta L_2-t_2/20$ ($\mu$m). Further, it is preferred to form the current restriction portion in the region being spaced by 0.93 $\mu$m or more both for the distance from the end C at the upper surface on the growing side of the seed crystal layer 12 along the arranging direction A and for the distance from the center of the spacing region for the seed crystal layer 12 along the arranging direction A and it is further preferred to form the current restriction region in the inside of the region with the distance from the upper surface on the growing side of the seed crystal layer 12 along the arranging direction A is: $\Delta L_1+0.93$ ($\mu$m) and the distance from the associated portion B along the arranging direction A is: $\Delta L_2+0.93$ ($\mu$m).

After forming the current restriction portion, an insulator 20 comprising silicon dioxide is formed, for example, by a vapor deposition method over the entire exposed surface, and an opening is disposed corresponding to the p-side contact layer 19 to expose the p-side contact layer 19 to the surface. After exposing the p-side contact layer 19, an opening is formed in the region of the insulator 20 above the n-side contact layer, and titanium (Ti), aluminum (Al), platinum and gold are vapor deposited successively in the opening and alloyed to form an n-side electrode 21. Further, palladium, platinum and gold are successively vapor deposited to the surface of the p-side contact layer 19 and the vicinity thereof to form a p-side electrode 22. Subsequently, the substrate 11 used for growing is ground to a thickness, for example, of about 80 $\mu$m. After grinding the substrate 11, it is shaped into a predetermined size, and reflector membranes (not illustrated) are formed to a pair of resonator end faces opposed in the longitudinal direction of the p-side contact layer 19. Thus, the semiconductor laser shown in FIG. 1 is completed.

Then, the operation of the semiconductor is to be explained.

In this semiconductor laser, when a predetermined voltage is applied between the n-side electrode 21 and the p-side electrode 22, current is injected into the active layer 16 and light emission is caused by electron-hole recombination. Since the product of the width $w_1$ ($\mu$m) and the thickness $t_1$ ($\mu$m) of the seed crystal layer is 15 or less, fluctuation of the crystallographic axes in the n-side contact layer 13 is decreased. Accordingly, crystallinity of the semiconductor layers from the n-type clad layer 14 to the p-type contact layer 19 laminated on the n-side contact layer 13 is improved. Accordingly, degradation of the device less occurs and the life time is extended.

As described above according to the semiconductor laser of this embodiment, since the width $w_1$ ($\mu$m) and the thickness $t_1$ ($\mu$m) for the seed crystal layer 12 is defined as 15 or less, fluctuation of the crystallographic axes in the n-side contact layer 13 can be decreased. Accordingly, the crystallinity of the semiconductor layer from the n-type clad layer 14 to the p-side contact layer 19 laminated on the n-side contact layer 13 can be improved. Accordingly, degradation by the application of the voltage less occurs and the life time of the semiconductor laser can be extended. Further, the ratio of the non-emissive recombination caused by the penetrative dislocation can be decreased to improve the light emission efficiency.

Further, when the injection region for the active layer 16 is disposed corresponding to the region between the seed crystal layer 12 and the associated portion B, the light emission efficiency can be improved further. Further, when the injection region is disposed corresponding to the inside of the region spaced apart from the seed crystal layer 12 by $\Delta L_1=(t_2-t_1)/20$ ($\mu$m) or more and spaced apart from the associated portion B by $\Delta L_2=t_2/20$ ($\mu$m) or more, or when the injection region is disposed corresponding to the inside of the region spaced apart from the seed crystal layer 12 and the associated portion B by 0.93 $\mu$m or more respectively, a higher effect can be obtained.

Particularly, when the half-width of the rocking curve by X-ray diffraction in the seed crystal layer 12 is restricted to 300 arcsec or less, fluctuation of the crystallographic axes can be decreased further.

Further, when the spacing distance $d_1$ between the seed crystal layers 12 along the arranging direction A is defined as 9 $\mu$m or more, the degree of freedom in manufacture, for example, upon mask alignment is increased and productivity can be improved.

Further, since the concave portion 11a is disposed corresponding to the spacing region between the seed crystal layers 12 in the substrate 11 used for growing, this can prevent crystals growing laterally from the seed crystal layer 12 from contact with the substrate 11 used for growing upon growing the n-side contact layer 13 on the basis of the seed crystal layer 12. Accordingly, density for the penetrative dislocations $M_1$, $M_2$ can be lowered in the n-side contact layer 13 and the n-type clad layer 14, the n-type guide layer 15, the active layer 16, the p-type guide layer 17, p-type clad layer 18 and the p-side contact layer 19 formed thereon, and fluctuation of the crystallographic axes can be decreased.

[Second Embodiment]

Figure 11:
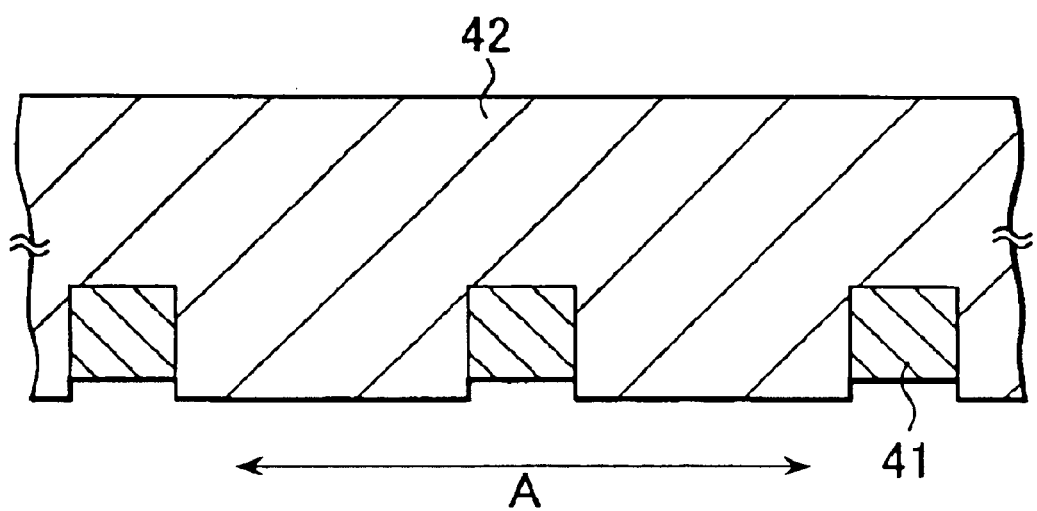
FIG. 11 is a cross sectional view illustrating the constitution of a nitride series III–V group compound substrate according to a second embodiment of this invention.

FIG. 11 illustrates a cross sectional structure of a nitride series III–V group compound substrate according to the second embodiment of this invention. The nitride series III–V group compound semiconductor comprises a plurality of spaced apart seed crystal layers 41, and a substrate main body 42 as a crystal growth layer which is grown on the basis of the plurality of the seed crystal layers 41. The seed crystal layer 41 and the substrate main body 42 comprise crystals of nitride series III–V group compound containing at least one of IIIb group elements in the short form periodic table and at least nitrogen in the Vb group element in the short form periodic table. The nitride series III–V group compound means herein both of semiconductor and not semiconductor compounds.

The seed crystal layer 41 has the same constitution, function and the effect as those of the seed crystal layer 12, for example, in the first embodiment. The substrate main body 42, for example, has a thickness from 10 $\mu$m to 200 $\mu$m and comprises an n-type GaN with addition of silicon as an n-type impurity. The substrate main body 42 has a lateral growing region grown in the lateral direction from the seed crystal layers 41 (arranging direction A) corresponding to the spacing region for the seed crystal layers 41.

The nitride series III–V group compound substrate can be obtained, for example, by forming the seed crystal layer 41 on a substrate used for growing comprising sapphire (not illustrated) like that in the first embodiment and growing the substrate main body 42 on the basis of the seed crystal layer 71 and then removing the substrate used for growing (not illustrated) in the same manner as in the case of growing the n-side contact layer 13 in the first embodiment.

The nitride series III–V group compound according to this embodiment can be used, for example, for a laser for growing an n-type clad layer, an active layer and a p-type clad layer on one surface thereof like that in the first embodiment.

EXAMPLE

Further, concrete examples of this invention are to be explained specifically.

Examples 1-1 to 1-10

A plurality of band-like seed crystal layers each comprising GaN are formed in parallel on the substrate used for growing comprising sapphire, and a crystal growth layer comprising GaN was grown on the basis of the seed crystal layer. In this case, the thickness $t_1$ the width $w_1$ and the spacing distance $d_1$ of the seed crystal layer were changed respectively in Examples 1-1 to 1-10 as shown in Table 1. The growing rate for the crystal growth layer was set to 3 μm/h to 4 μm/h.

TABLE 1

|  | Thickness of seed crystal layer $t_1$(μm) | Width of seed crystal layer $w_1$ (μm) | Spacing layer for seed crystal layer $d_1$ (μm) |
| --- | --- | --- | --- |
| Example 1-1 | 2 | 2 | 10 |
| Example 1-2 | 3 | 2 | 9 |
| Example 1-3 | 2 | 2.5 | 13.5 |
| Example 1-4 | 3 | 2.5 | 13.5 |
| Example 1-5 | 2 | 3 | 13 |
| Example 1-6 | 1 | 4 | 12 |
| Example 1-7 | 2 | 4 | 12 |
| Example 1-8 | 2 | 5 | 11 |
| Example 1-9 | 3 | 5 | 12 |
| Example 1-10 | 2 | 6 | 10 |
| Comp. Exam. 1-1 | 4 | 4 | 12 |
| Comp. Exam. 1-2 | 3 | 6 | 12 |

As Comparative Examples 1-1 and 1-2 relative to Examples 1-1 to 1-10, crystal growth layers were grown in the same manner as in Examples 1-1 to 1-10 except for changing the thickness $t_1$, width $w_1$ and the spacing distance $d_1$ of the seed crystal layer, respectively, as in Table 1.

The thus obtained crystal growth layers in Examples 1-1 to 1-10 and Comparative Examples 1-1 to 1-2 were analyzed by an X-ray diffraction method. The results are shown in FIG. 12 and FIG. 13.

Figure 12:
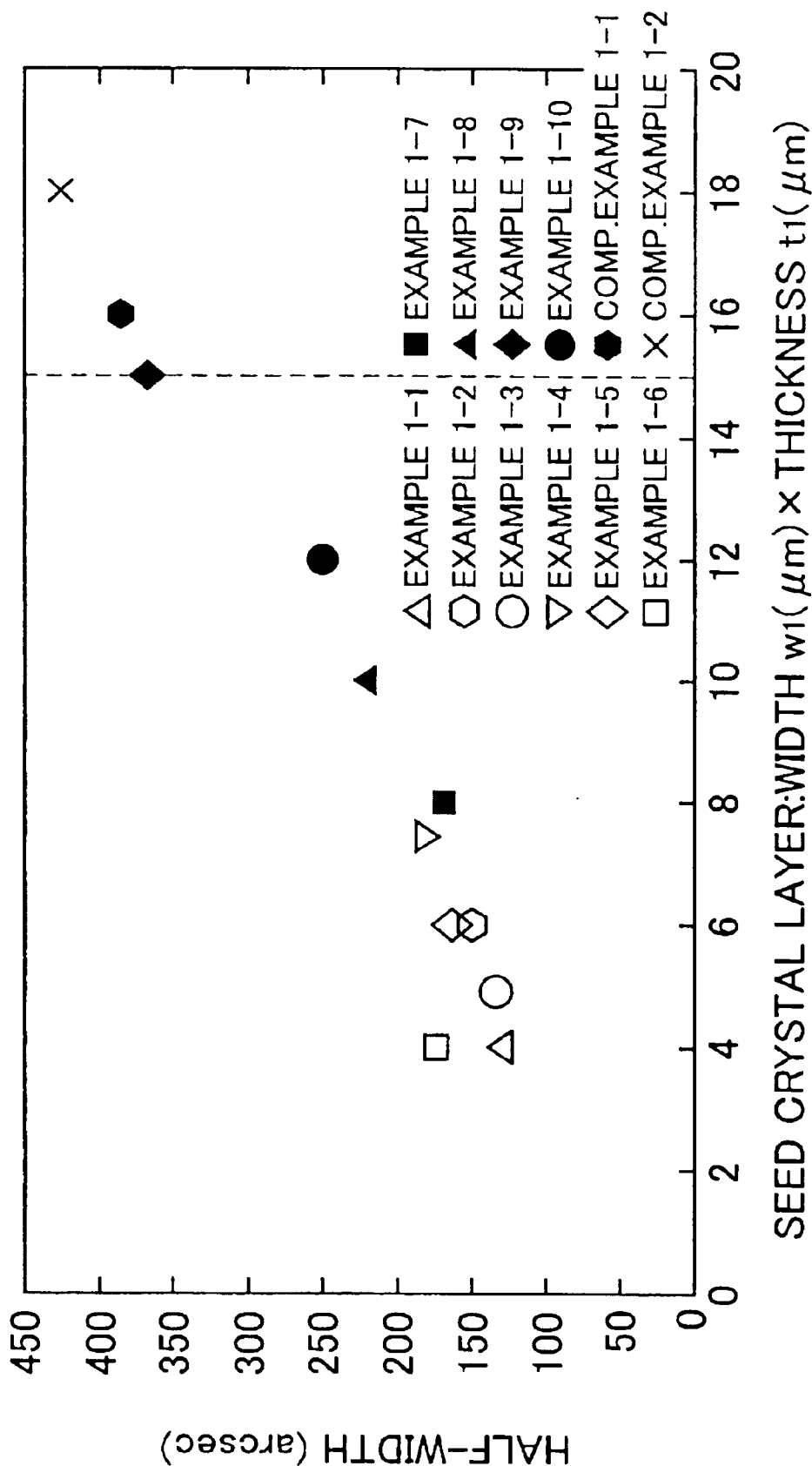
FIG. 12 is a characteristic chart expressing a relation between a seed crystal layer and a half-width in a crystal growth layer according to Example 1 of this invention.
Figure 13:
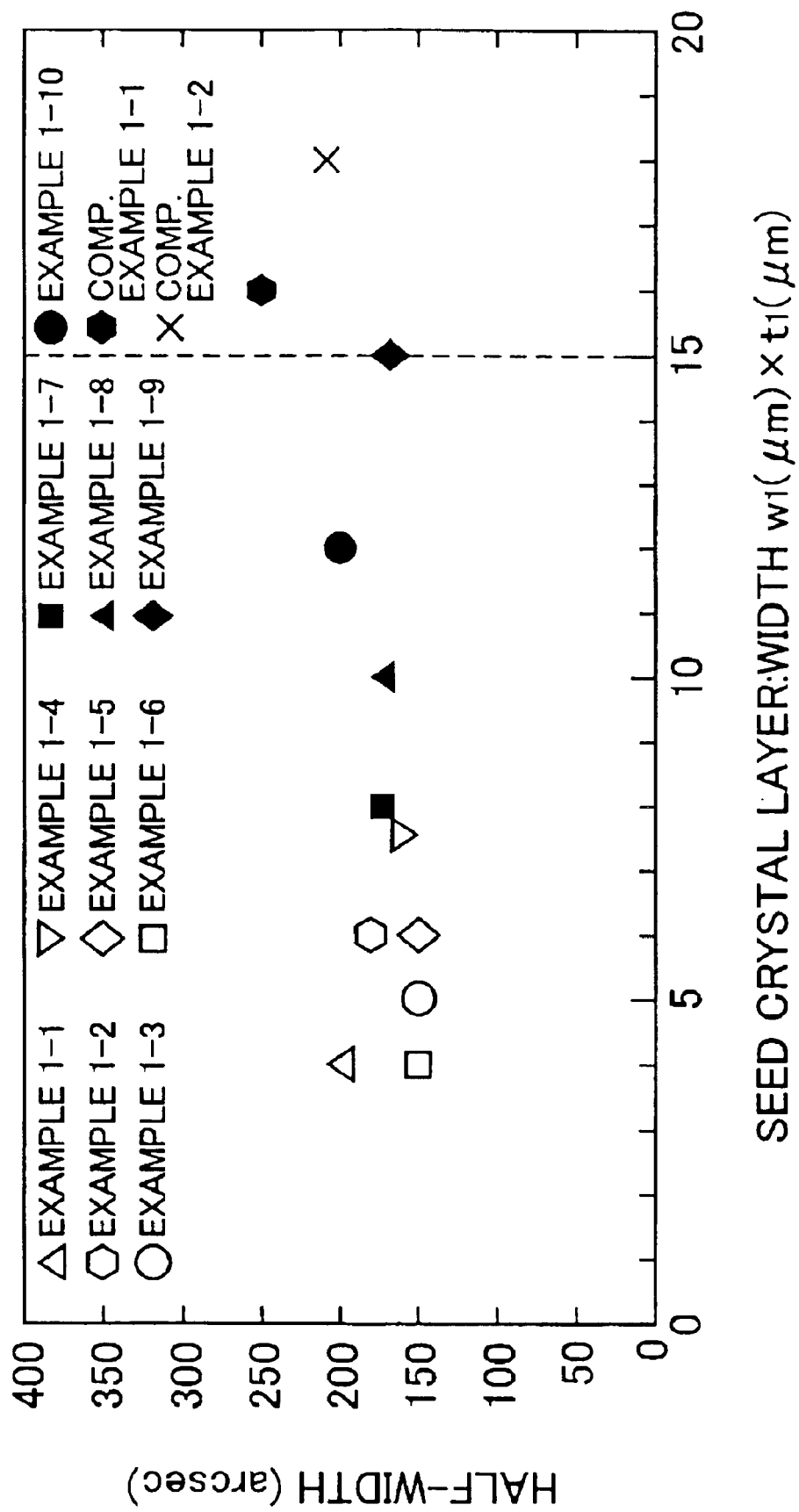
FIG. 13 is another characteristic chart expressing a relation between a seed crystal layer and a half-width in a crystal growth layer according to Example 1 of this invention.

FIG. 12 shows half-width values for the rocking curves measured upon incidence of X-rays along the arranging direction of the seed crystal layers. Further, FIG. 13 represents the half-width for rocking curves measured upon of X-rays in the extending direction of the seed crystal layers. In FIG. 12 and FIG. 13, the half-width (unit: arcsec) is shown on the ordinate and the product of width $w_1$ (unit: μm) and thickness $t_1$ (unit: μm) of the seed crystal layer is expressed on the abscissa.

As can be seen from FIG. 12, the half-width along the arranging direction of the seed crystal layers was narrower in Examples 1-1 to 1-10 than in Comparative Examples 1-1 and 1-2, and it was observed that the half-width tended to be narrowed as the product of the width $w_1$×thickness $t_1$ of the seed crystal layer was smaller. That is, it was found that fluctuation of the crystallographic axes in the crystal growth layer along the arranging direction of the seed crystal layers is decreased and a crystal growth layer having higher crystallinity could be obtained by setting the product of the width $w_1$ (μm) and the thickness $t_1$ (μm) of the seed crystal layer to 15 or less. Further, it was found that the fluctuation of the crystallographic axes was further decreased when the product of the width $w_1$ (μm) and the thickness $t_1$(μm) was set to 10 or less and, it was further decreased at 8 or less. It was further found a trend that the fluctuation was particularly lowered when the product was 6 or less.

Particularly, when comparing Examples 1-1 and 1-2, Examples 1-3 and 1-4, Examples 1-6 and 1-7 and Comparative Example 1-1, it was found that the half-width was broader and the crystallinity tended to be degraded as the thickness $t_1$ increased in a case where the width $w_1$ of the seed crystal layer was identical. In the same manner, when comparing Examples 1-1, 1-5, 1-7, 1-8 and 1-10, it was found a trend that the half-width was broader and the crystallinity was degraded as the width $w_1$ increased in a case where the thickness $t_1$ was identical.

Further, as can be seen from FIG. 13, regarding the half-width in the extending direction of the seed crystal layer, no substantial difference was found between Examples 1-1 to 1-10 and Comparative Examples 1-1 and 1-2. That is, it was found that fluctuation of the crystallographic axes in the crystal growth layer in the extending direction of the seed crystal layer did not tend to depend on the product of the width $w_1$ and the thickness $t_1$ of the seed crystal layer.

Example 2

Figure 14:
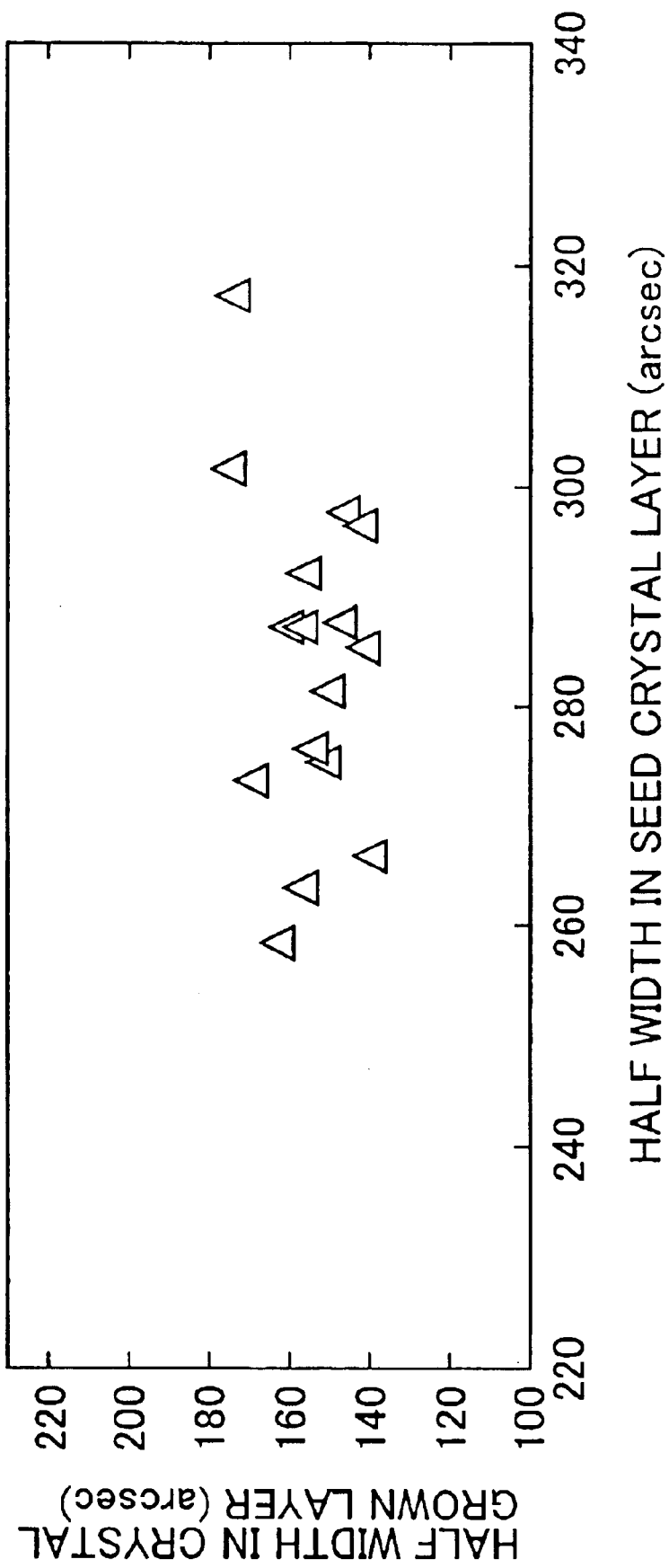
FIG. 14 is a characteristic chart expressing a relation between a half-width in a seed crystal layer and a half-width in a crystal growth layer according to Example 2 of this invention.
Figure 15:
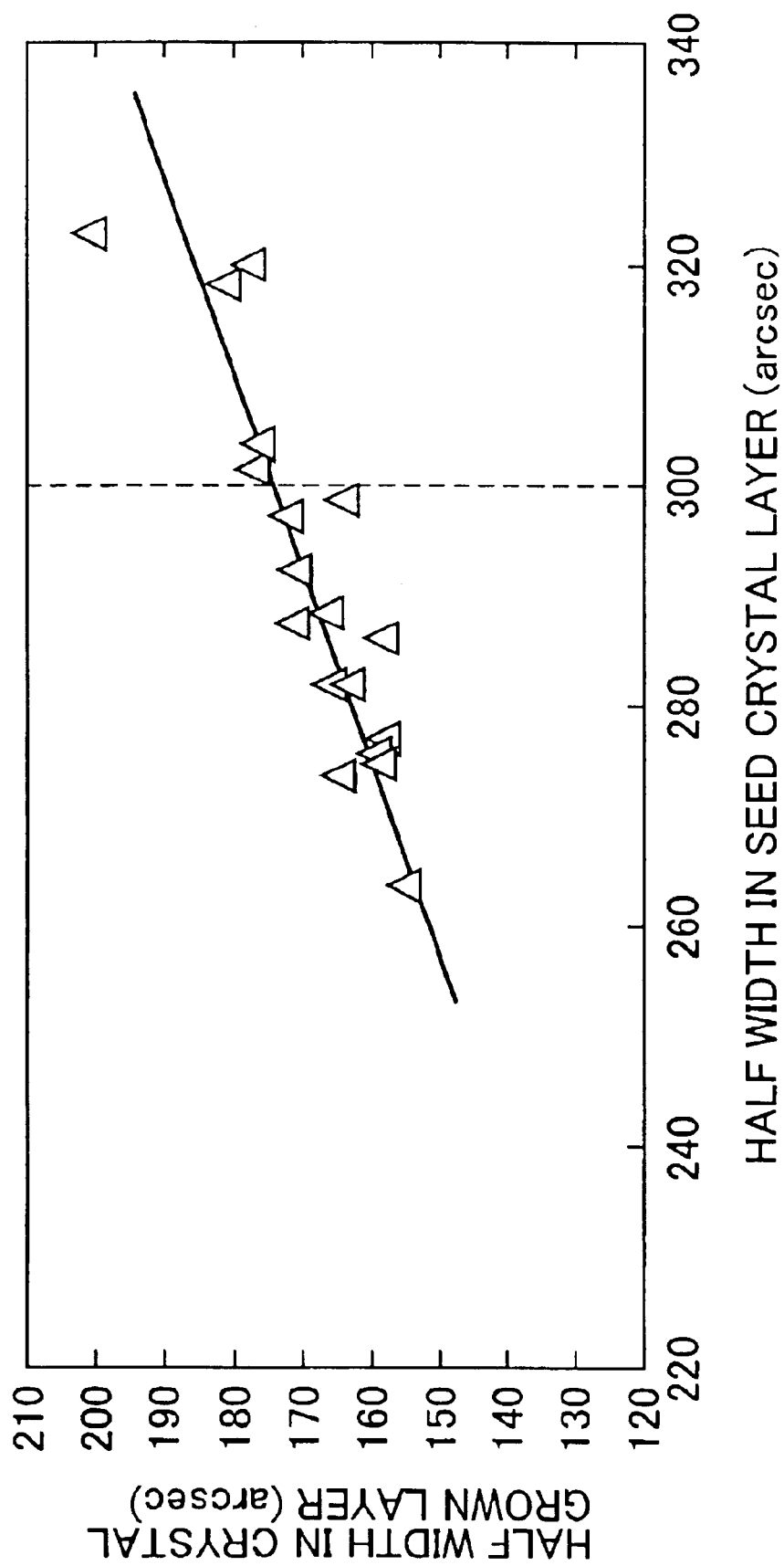
FIG. 15 is another characteristic chart expressing a relation between a half-width in a seed crystal layer and a half-width in a crystal growth layer according to Example 2 of this invention.

A crystal growth layer was grown in the same manner as in Examples 1-1 to 1-10 except for setting the thickness $t_1$ to 2 μm, the width $w_1$ to 3 μm, the spacing distance $d_1$ to 9 μm for the seed crystal layer. In this example, when the seed crystal layer was formed, X-rays were irradiated from the upper surface of the growing side to measure the half-width of the rocking curve by x-ray diffractiometry in the seed crystal layer. Further, the half-width was measured also for the resultant crystal growth layer. FIG. 14 and FIG. 15 shows the result.

FIG. 14 shows the half-width for the rocking curves in the crystal growth layer measured upon incidence of X-rays along the arranging direction of the seed crystal layers. FIG. 15 shows the half-width for the rocking curve in the crystal growth layer measured upon incidence of X-rays in the extending direction of the seed crystal layer. In FIG. 14 and FIG. 15, the half-width of the crystal growth layer (unit: arcsec) is expressed on the ordinate while the half-width of the of the seed crystal layer (unit: arcsec) is expressed on the abscissa.

As can be seen from FIG. 14, the half-width along the arranging direction of the seed crystal layers varied greatly and no distinct dependence on the half-width of the seed crystal layer could be observed.

On the other hand, as can be seen from FIG. 15, a trend was observed that the half-width in the extending direction of the seed crystal layer was narrowed as the half-width of the seed crystal layer was narrower and the crystallinity of the crystal growth layer was higher. Particularly, it was found that the half-width of the crystal growth layer could be decreased to 180 arcsec or less when the half-width of the seed crystal layer was 300 arcsec or less.

That is, when the half-width for the rocking curve by the X-ray diffractiometry for the upper surface of the growing side of the seed crystal layer was restricted to 300 arcsec or less, the fluctuation of the crystallographic axes in the crystal growth layer could be decreased at least in the extending direction of the seed crystal layer.

Examples 3-1 to 3-6

Crystal growth layers were grown in the same manner as in Examples 1-1 to 1-10 except for changing the thickness $t_1$ to 2 μm, the width to 3 μm and the spacing distance $d_1$ for the seed crystal layer to 9 μm and varying the growing rate for the crystal growth layer as shown in Table 2. Also in this examples, X-rays were irradiated for the crystal growth layer along the arranging direction of the seed crystal layers and they were analyzed by the x-ray diffraction method. Table 2 shows the shape of peaks in the obtained rocking curves.

TABLE 2

| | Growing rate (μm/h) | Shape of peak in the rocking curve |
|---|---|---|
| Example 3-1 | 8 | Separated |
| Example 3-2 | 6 | Separated |
| Example 3-3 | 4 | Single peak |
| Example 3-4 | 3 | Single peak |
| Example 3-5 | 2 | Single peak |
| Example 3-6 | 1 | Single peak (with surface roughness) |

As can be seen from Table 2, it was confirmed that single peak was obtained in Examples 3-3 to 3-6 and the crystallographic axes of the crystal growth layer were entirely aligned. However, in Example 3-6 where the growing rate was 1 μm/h, surface roughness was caused. This is considered that since the growth in the portion corresponding to the upper surface of the seed crystal layer 12 was slow, the surface etching such as by a carrier gas was predominant. Further, the peak was separated in Examples 3-1 and 3-2. This shows that while the crystallographic axes were aligned in the minute region, the direction of the axes was in two directions. Particularly, in Example 3-1, the half-width was broad, fluctuation was remarkable to the crystallographic axes of the crystal growth layer and, in addition, the surface of the crystal growth layer did not form a fine flat surface although not shown specifically.

That is, it was found that a crystal growth layer with less fluctuation of the crystallographic axes could be obtained when the crystal growth layer was grown at a rate of 6 μm/h or lower. Further, it was found that a crystal growth layer in which crystallographic axes were aligned as a whole could be obtained when the crystal growth layer was grown at a rate of 4 μ/m or lower. Further, it was found that a crystal growth layer with a finely flattened surface could be obtained by growing at a rate of 2 μm/h or higher.

Although not shown specifically, similar effects can also be obtained in a case of growing a crystal growth layer comprising III–V group nitride semiconductor other than GaN containing at least one of group III elements and nitrogen.

While this invention has been described above with reference to preferred embodiments and the examples, this invention is not restricted to the preferred embodiments and the examples described above but can be modified variously. For example, in the preferred embodiments and the examples, explanations have been made to a case of providing a plurality of band-like seed crystal layers 12 and 41, but only one layer may be disposed finally depending on the size of the device. Further, it may be in a lattice-like or an island pattern.

Further, in the preferred embodiments and the examples described above, current was restricted by forming a portion of the p-type clad layer 18 and the p-side contact layer 19 each into a fine stripe-like shape extending in the direction shown by indication the described previously from the seed crystal growth layer 12b, but the current may be restricted with a fine band-like shape extending in other directions and the current may also be restricted by other structures.

Further, the explanation has been made to a case of having the substrate 11 used for growing in the preferred embodiments and the examples, but the substrate 11 used for growing may be removed after growing crystals. In this case, the n-side electrode and the p-side electrode may be disposed on the surface side and the rear face side separately.

In addition, the substrate 11 used for growing comprises sapphire or silicon carbide in the preferred embodiments and examples described above, but it may comprise other materials such as gallium nitride (GaN), spinnel ($MgAl_2O_4$), Si or gallium arsenide (GaAs).

Furthermore, the n-side contact layer 13 is formed after removing the insulator 31 in the preferred embodiments and examples described above, but the n-side contact layer 13 (crystal growth layer in the examples) may be formed without removing the insulator 31 on the seed crystal layer 12. This can interrupt the penetrative dislocation $M_1$ by the insulator 31 to prevent propagation of the penetrative dislocation $M_1$ from the seed crystal layer 12. Accordingly, crystal defects scarcely exist in the n-side contact layer 13 excepting for the penetrative dislocation $M_2$ caused by association and a III–V group nitride semiconductor having excellent crystallinity can be obtained on the upper side thereof. However, when the n-side contact layer 13 is grown, it may be a worry that the constituent material for the insulator 31 may intrude as an impurity into the n-side contact layer to deteriorate the characteristics of the semiconductor laser, so that it is preferred to select an appropriate manufacturing method depending on the purpose of use or the like.

Further, in each of preferred embodiments and examples described above, the growth layer 12a for seed crystal layer and the n-side contact layer 13 were grown by the MOCVD method, but they may be formed also by other vapor deposition method such as an MBE (Molecular Beam Epitaxy) method, a hydride vapor deposition method or a halide vapor deposition method.

Further, while the semiconductor device has been explained with reference to a semiconductor laser as a concrete example in the preferred embodiments described above, this invention is applicable also to other semiconductor devices such as light emission diodes or field effect transistors.

[Third Embodiment]

Figure 16:
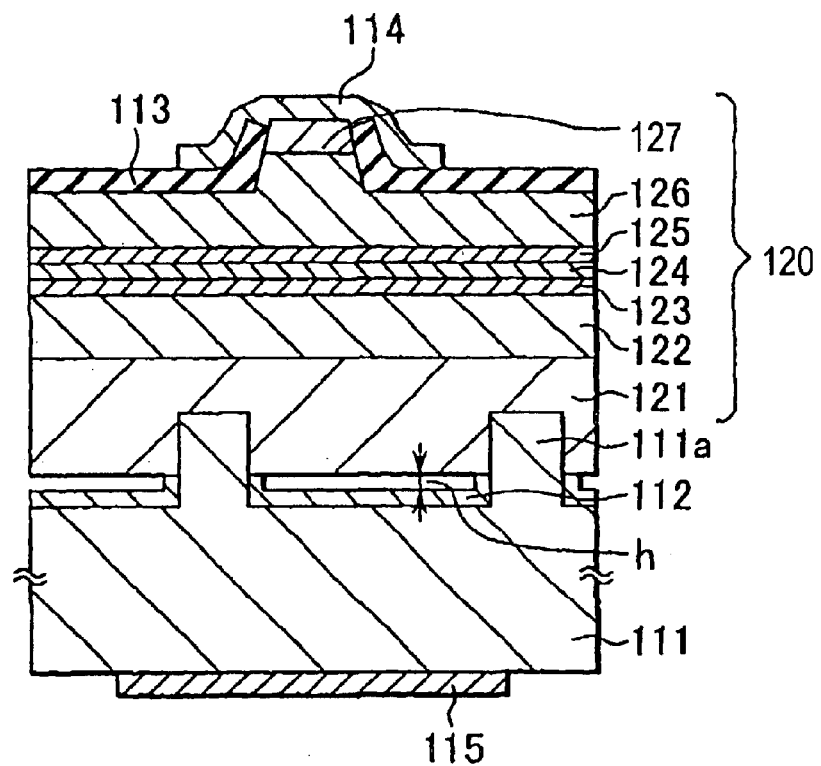
FIG. 16 is a cross sectional view illustrating the constitution of a semiconductor laser of a semiconductor device according to a third embodiment of this invention.

FIG. 16 shows a cross sectional structure of a semiconductor laser as a semiconductor device according to a preferred embodiment of this invention. The semiconductor laser comprises a substrate 111 comprising a nitride series III–V group compound, and a semiconductor layer 120 comprising a nitride series III–V group compound semiconductor laminated on one surface of the substrate 111. The nitride series III–V group compound or the nitride series III–V group compound semiconductor means a compound or a compound semiconductor containing at least one of IIIb group elements in the short form periodic table and at least nitrogen in Vb group elements in the short form periodic table.

The substrate 111 has a thickness in the laminating direction of a semiconductor layer 120 (hereinafter simply referred to as (thickness) of 250 μm and comprises n-type GaN with addition of silicon (Si) as an n-type impurity. Protruded seed crystal portions 111a are formed on one surface of the substrate 111. The seed crystal portions 111a extend, for example, in a band-like shape (extended in a direction perpendicular to the drawing of FIG. 16) and disposed in plurality while being spaced apart in a stripe pattern. The seed crystal portions 111a are formed, for example, on the (0001) face of the substrate 111 and extended in the direction shown by the following indication $<1\bar{1}00>$ or $<11\bar{2}0>$ The width of each of the seed crystal portions 111a at the boundary relative to a buffer layer 121 along the direction of arranging them (direction perpendicular to the extending direction) is preferably within a range, for example, from 1.5 μm to 6 μm and, more preferably, 2 μm or more and 5 μm or less. This is because the buffer layer 121 tends to be defoliated during manufacture when the width is narrower, whereas fluctuation tends to be caused to the crystallographic axes in the buffer layer 121. The spacing distance between the seed crystal portions 111a is preferably, for example, 9 μm or more and, more preferably, 10 μm or more. This is because the process margin is narrowed to lower the productivity upon mask alignment or the like during manufacture if the spacing distance is shorter. The height for the seed crystal portion 111a is, for example, from 1 μm to 3 μm. If it is lower than 1 μm, it is difficult to ensure a gap between a growth suppression layer 112 to be described later and the semiconductor layer 120, whereas if it is higher than 3 μm, the crystallographic axes are less aligned in the semiconductor layer 120.

A growth suppression layer 110 having an opening corresponding to the seed crystal portion 111a is disposed between the substrate 111 and the semiconductor 120. The growth suppression layer 112 is used for growing the semiconductor layer 120 on the basis of the seed crystal portion 111a of the substrate 111 and inhibiting the semiconductor layer 120 from growing from the spacing region for the seed crystal portion 111a. The growth suppression layer 112 comprises, for example, a dielectric material and, specifically, it comprises a single layered film of silicon dioxide ($SiO_2$), silicon nitride ($Si_3N_4$), titanium dioxide ($TiO_2$) or aluminum oxide ($Al_2O_3$) or a laminate film using two or more of them.

The growth suppression layer 112 is preferably adapted to cover not only the spacing region for the seed crystal region 111a but also the single crystal portion 111a along the base portion thereof so as to define a gap between the semiconductor layer 120 and the growth suppression layer 112. This is for the inhibition of contact between the semiconductor layer 120 and the substrate 111 which would cause defects when the semiconductor layer 120 is grown on the basis of the seed crystal portion 111a. A preferred height h for the rising portion of the growth suppression layer 112 along the seed crystal portion 111a is, for example, 10 μnm or more. If it is less than 10 nm, it can not effectively prevent contact between the semiconductor layer 120 and the growth suppression layer 112.

Further, the grow suppression layer 112 preferably has a function of reflecting or absorbing light generated in the semiconductor layer 120, because this can suppress the leakage of light generated in the semiconductor layer 120 from the side of the substrate 111 and suppress the intrusion of stray light reflected in a package or the like from the side of the substrate 111 when the device is used being contained in the package. Such a function can be obtained also by constituting the growth suppression layer 112 with the material described above.

The semiconductor layer 120 is grown on the basis of Lo the seed crystal portion 111a of the substrate 111 in which a buffer layer 121, an n-type clad layer 122, an n-type guide layer 123, an active layer 124, a p-type guide layer 125, a p-type clad layer 126 and a p-side contact layer 127 are laminated in this order from the side of the substrate 111.

The buffer layer 121 has a thickness, for example, of 5.0 μm and comprises an n-type GaN with addition of silicon as an n-type impurity. The buffer layer 121 has a lateral growing region growing in a direction different from the laminating direction of the semiconductor layer 120 on the basis of the side wall surface of the seed crystal portion 116. The lateral growing region means, specifically, a region having a growing component in a direction perpendicular to the laminating direction of the semiconductor layer 120.

Figure 17:
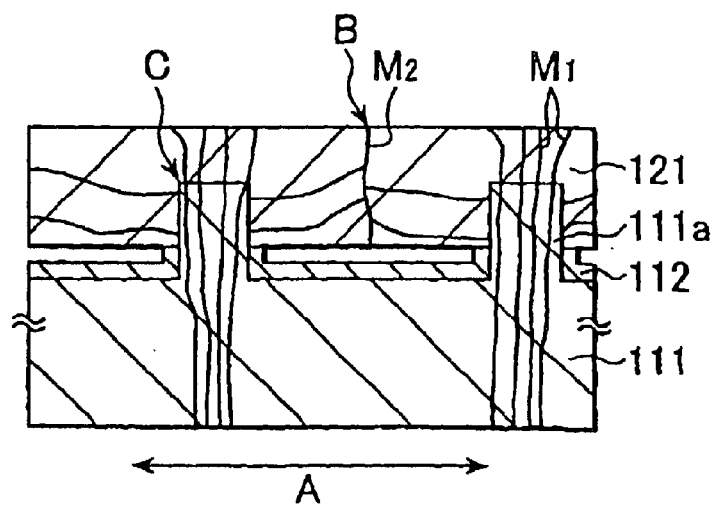
FIG. 17 is a schematic view illustrating a state of generation of penetrative dislocation in a buffer layer of the semiconductor laser shown in FIG. 16.

In the lateral growing direction, as shown FIG. 17, the penetrative dislocation $M_1$ from the seed crystal portion 111a less propagates and the dislocation density is lowered. This lowers the dislocation density for the portion corresponding to the lateral growing direction, for example, as $1\times10^6$ $cm^{-2}$ or less also for the semiconductor layer 120 from the n-type clad layer 122 to the p-side contact layer 127 laminated on the buffer layer 121. On the contrary, in the region of the buffer layer 121 corresponding to the seed crystal portion 121a, the penetrative dislocation $M_1$ from the seed crystal portion 111a propagates. The buffer layer 121 also contains an associated portion B formed when crystals that grow in the direction different from the laminating direction are associated to each other about at the central portion of the lateral growing region, and penetrative dislocation $M_2$ formed by association exists in the associated portion B. The penetrative dislocation $M_2$ often propagates to the semiconductor layer 20 including from the n-type clad layer 122 to the p-side contact layer 127 laminated on the buffer layer 121.

The n-type clad layer 122 has a thickness, for example, of 1 μm and comprises n-type AlGaN mixed crystals with addition of silicon as an n-type impurity. The n-type guide layer 23 has a thickness, for example, of 0.1 μm and comprises an n-type GaN with addition of silicon as an n-type impurity.

The active layer 124 has a thickness, for example, of 30 nm and has a multiple quantum well structure in which $Ga_xIn_{1-x}N$ ($1 \geq x \geq 0$) mixed crystal layers of different compositions are laminated. The active layer 124 has a current injection region to which current is injected and the current injection region functions as a light emitting region.

The p-type guide layer 125 has a thickness, for example, of 0.1 μm and comprises a p-type GaN with addition of magnesium (Mg) as a p-type impurity. A p-type clad layer 126 has a thickness, for example, of 0.8 μm and comprises a p-type AlGaN mixed crystals with addition of magnesium as a p-type impurity. A p-side contact layer 127 has a thickness, for example, of 0.5 μm and comprises a p-type GaN with addition of magnesium as a p-type impurity. The p-side contact layer 127 and a portion of the p-type contact layer 126 are formed each into a fine band-like shape (a band-like shape extended in the direction perpendicular to the drawing in FIG. 16), to constitute a current restriction portion.

The current restriction portion is for the restriction of the current injection region in which current is injected to the active layer 124 and a portion of the active layer 124 corresponding to the current restriction portion forms a current injection region, which constitutes a light emitting region. Accordingly, for preventing degradation and improving the characteristics of the device, it is preferred that the current injection region (that is, the current restriction portion) is formed corresponding to the lateral growing direction of low dislocation density. However, since the penetrative dislocation $M_2$ exists in the associated portion B of the crystals (refer to FIG. 17), it is further preferred that the current injection region is disposed corresponding to the region between the seed crystal portion 111$a$ and the associated portion B.

As the thickness of the semiconductor layer 120 increases, the penetrative dislocation $M_1$ tends to propagate while extending by $\Delta L_1$ from the end C at the boundary of the seed crystal portion 111$a$ on the side of the active layer 124 along the arranging direction, while the penetrative dislocation $M_2$ tends to propagate while extending by $\Delta L_2$ from the associated portion B along the arranging direction. Accordingly, in the vicinity of the seed crystal portion 111$a$ and the associated portion B, it may be a worry that penetrative dislocations $M_1$, $M_2$ should propagate. Accordingly, for lowering the possibility that the penetrative dislocations $M_1$, $M_2$ intrude into the light emitting region and obtaining satisfactory device characteristics, it is preferred to dispose the current injection region corresponding to the inside of the region spaced apart by $\Delta L_1$ or more from the end C at the boundary of the seed crystal portion 111$a$ on the side of the active layer 124 along the arranging direction and spaced by $\Delta L_2$ or more from the associated portion B along the arranging direction.

By the way, extensions $\Delta L_1$ and $\Delta L_2$ of the penetrative dislocations $M_1$, $M_2$ are in a proportional relation with the thickness of the semiconductor layer 120. For example, the extension $\Delta L_1$ of the penetrative dislocation $M_1$ is approximated as: $\Delta L_1=(t_1-t_2)/20$, while the extension $\Delta L_2$ of the penetrative dislocation $M_2$ is approximated as: $\Delta L_2=t_1/20$ where $t_1$ represents the sum for the thickness of the buffer layer 121, the n-type clad layer 122, the n-type guide layer 123, the active layer 124, the p-type guide layer 125, the p-type clad layer 126 and the p-side contact layer 127 in the spacing region of the seed crystal portion 111$a$ and $t_2$ represents the thickness for the portion of the seed crystal portion 111$a$ corresponding to the buffer layer 121. [0030]

Further, it is preferred that the injection region is formed corresponding to the inside of a region being spaced by 0.93 $\mu$m or more both for the distance from the end C at the boundary of the seed crystal portion 111$a$ on the side of the active layer 124 along the arranging direction A and for the distance from the associated portion B along the arranging direction A, since the device characteristics can be improved further. Since the diffusion length of the minority carriers in the GaN crystals is 0.93 $\mu$m and it is considered that the nitrogen series III–V group compound semiconductor used herein also has the same extent of diffusion length in crystals, the dislocation density can be lowered also for the diffusion region where the minority carriers are diffused from the injection region. Further, it is preferred that the light emitting region is disposed in a region spaced apart by $\Delta L_1+0.93$ ($\mu$m) or more from the seed crystal portion 111$a$ along the arranging direction and spaced apart by $\Delta L_2+0.93$ ($\mu$m) or more from the associated portion B along the arranging direction, since the dislocation density can be further lowered in the diffusion region.

An insulator 113 comprising, for example, silicon dioxide ($SiO_2$) is formed on the semiconductor layer 120. An opening is formed to the insulator 113 corresponding to the p-side contact layer 127, and a p-side electrode 114 is formed on the p-side contact layer 127. The p-side electrode 114 has a structure formed, for example, by laminating palladium (Pd), platinum (Pt) and gold (Au) successively, which is electrically connected with the p-side contact layer 127. On the other hand, an n-side electrode 115 is disposed on the other side of the substrate 111, that is, on the side opposite to the semiconductor layer 120. The n-side electrode 115 has a structure formed, for example, by successively laminating titanium (Ti) and aluminum (Al) and alloying them by a heat treatment, which is electrically connected with the substrate 111.

Further, in the semiconductor laser, a pair of lateral sides of the p-side contact layer 127 opposed in the longitudinal direction constitute resonator end faces and a pair of reflector membranes (not illustrated) are formed respectively to the pair of the resonator end faces. Among the pair of the reflector membranes, the reflectivity is controlled such that one of the membranes has a low reflectivity while the other of them has a high reflectivity. In this structure, light generated in the active layer 124 is amplified while being reciprocated between the pair of the reflector membranes and then emitted as a laser beam from the reflector membrane at low reflectivity.

The semiconductor laser can be manufactured, for example, as described below.

Figure 18A:
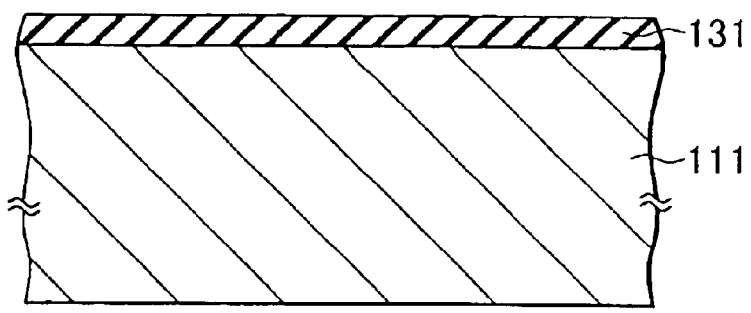
FIG. 18A to FIG. 18D are cross sectional views illustrating manufacturing steps of the semiconductor laser shown in FIG. 16.

At first, as shown in FIG. 18A, a substrate 111 comprising, for example, n-type GaN of 250 $\mu$m thickness is prepared. The substrate 111 can be formed, for example, by growing on a substrate used for growing comprising sapphire or the like by a hydride vapor deposition method or a halide vapor deposition method and then separating from the substrate for growing. By the way, the hydride vapor deposition method is a vapor deposition method in which hydride contributes to the reaction or transportation of starting material gases and the halide vapor deposition method is a vapor deposition method in which a halide contributes to the reaction or transportation of starting material gases.

Then, on the substrate 111 (for example on the (0001) face), a mask layer 131 comprising silicon nitride ($Si_3N_4$) or silicon dioxide ($SiO_2$) of 0.3 $\mu$m to 1 $\mu$m thickness is formed, for example, by a CVD (Chemical Vapor Deposition) method on the substrate 111. The mask 131 may be a laminate structure, for example, of a silicon nitride film and a silicon dioxide film.

Figure 18B:
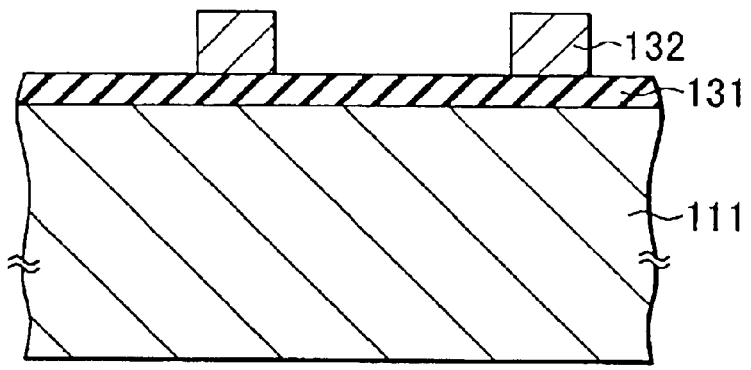
Figure 18C:
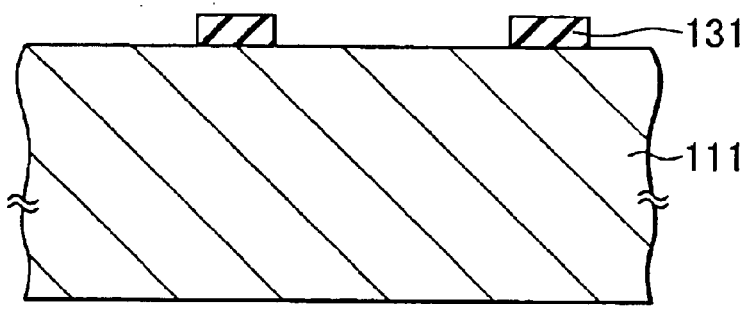

Successively, as shown in FIG. 18B, a photoresist film 132, for example, of 2 $\mu$m to 5 $\mu$m thickness is formed on the mask layer 131 and a pattern comprising a plurality of stripes each extended in the direction shown by the indication described previously is formed. The photoresist film 132 and the mask layer 131 are used for selectively etching the substrate 111 thereby forming a seed crystal portion 111$a$. After forming the pattern of the photoresist film 132, wet etching is applied, for instance, by using the photoresist film 132 as a mask to selectively remove the mask layer 131 as shown in FIG. 18C. Then, the photoresist film 132 is removed.

Figure 18D:
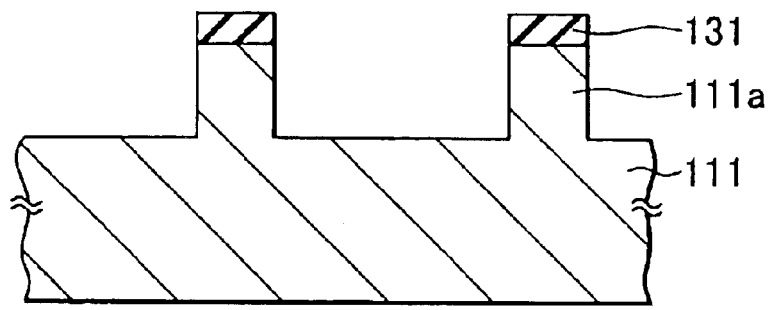

After removing the photoresist film 132, the substrate 111 is selectively removed utilizing the mask layer 131 by a reactive ion etching (RIE) method using, for example, a chlorine gas ($Cl_2$) as an etching gas as shown in FIG. 18D. A plurality of protruded seed crystal portions 111$a$ are formed being spaced apart from each other on the substrate 111.

Figure 19A:
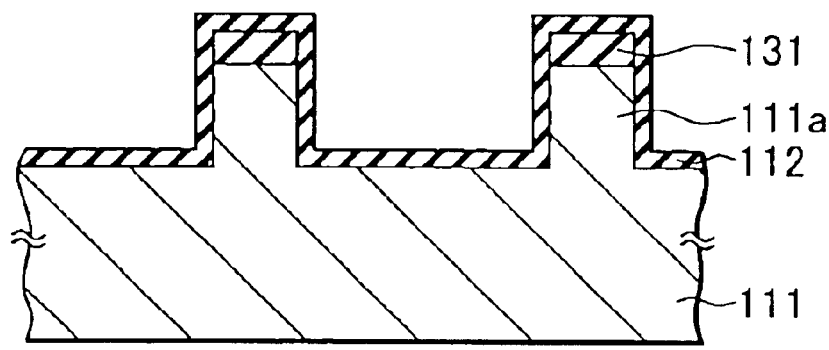
FIG. 19A to FIG. 19C are cross sectional views illustrating manufacturing steps succeeding to FIG. 18A to FIG. 18D.
Figure 19B:
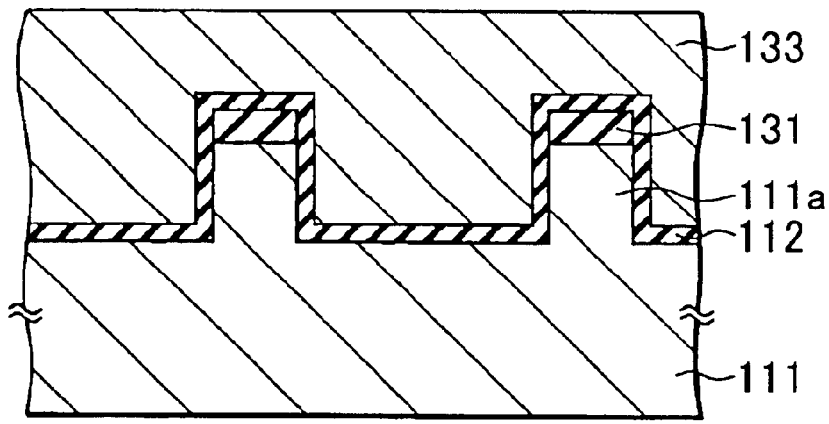
Figure 19C:
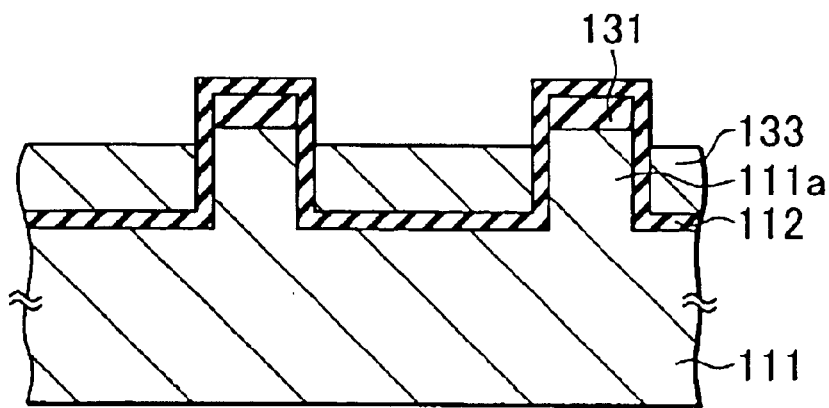

After forming the seed crystal portion 111$a$, as shown in FIG. 19A, a growth suppression layer 112 is formed on the substrate 111, for example, by a CVD method. After forming the growth suppression layer 112, as shown in FIG. 19B, a photoresist film 133 is coated on the substrate 111. Then, the photoresist film 133 is exposed to selectively remove the photoresist film 133 while leaving a portion corresponding to the spacing region for the seed crystal portion 111a as shown in FIG. 19C. In this case, the thickness of the photoresist film 133 is controlled by adjusting the amount of light or the exposure time such that the surface of the growth inhibition layer 112 corresponding to the seed crystal portion 111a is exposed but the surface of the growth suppression layer 112 corresponding to the spacing region for the seed crystal portion 111a is not exposed, for example, the photoresist film 133 is left at a thickness of less than 1 $\mu$m.

Figure 20A:
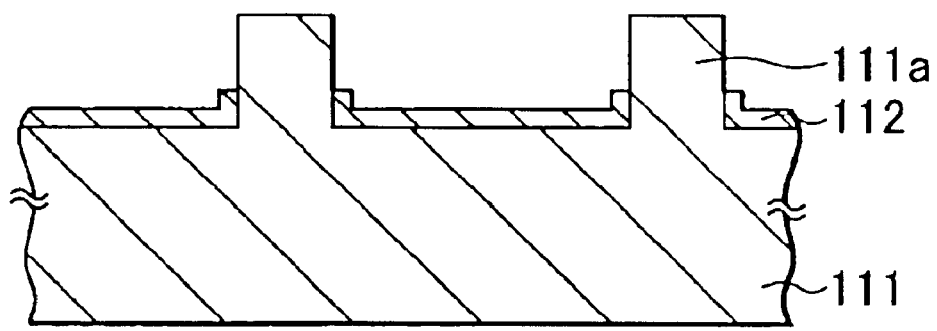
FIG. 20A and FIG. 20B are cross sectional views illustrating manufacturing steps succeeding to FIG. 19A to FIG. 19C.

After selectively removing the photoresist film 133, as shown in FIG. 20A, wet etching is applied, for example, by using the photoresist film 133 as a mask to selectively remove the growth suppression layer 112 and the mask layer 13 is removed. This forms an opening in the growth suppression layer 112 corresponding to the seed crystal portion 111a. When the opening is formed, it is preferred to leave a rising portion of the growth suppression layer 112 that covers the seed crystal portion 111a along the base portion thereof. Since the photoresist film 133 is also removed partially to reduce the thickness, it is preferred that the photoresist film 133 has an enough thickness including a portion to be etched. Subsequently, the photoresist film 133 is removed.

Figure 20B:
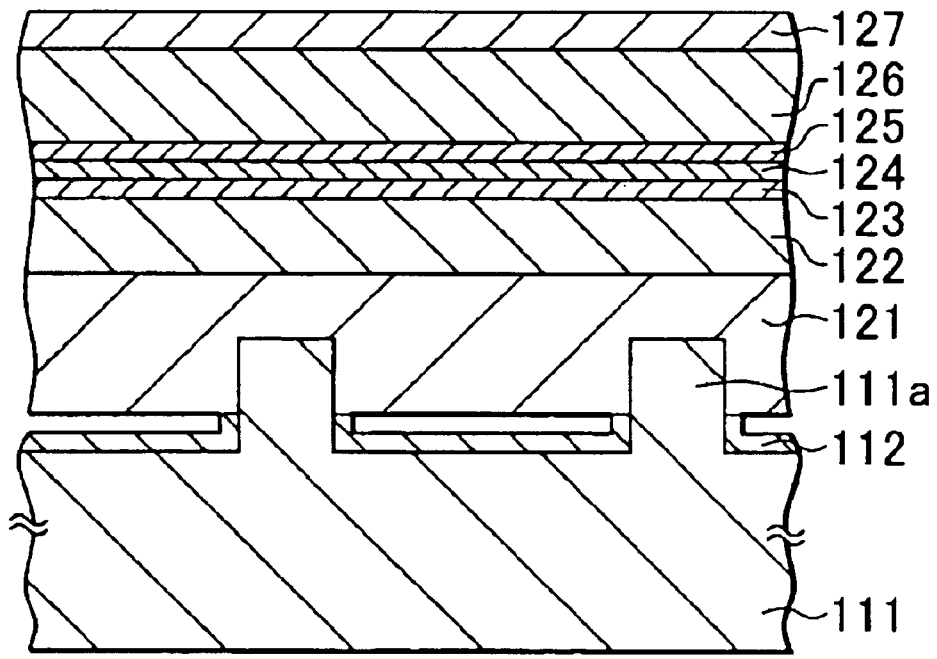

After removing the photoresist 133 selectively, as shown in FIG. 20B, a buffer layer 121 comprising n-type GaN is grown on the basis of the seed crystal portion 111a, for example, by an MOCVD (Metal Organic Chemical Vapor Deposition) method. In this case, crystal growth of the buffer layer 121 proceeds mainly from the upper surface and the lateral wall surfaces of the seed crystal portion 111a and also grows in the direction perpendicular to the laminating direction. After lapse of a predetermined period of time, crystals growing in the direction different from the laminating direction from the side wall surfaces are associated together to flatten the grown surface substantially.

Then, while the penetrative dislocation $M_1$ (refer to FIG. 17) propagates in the region of the buffer layer 121 corresponding to the seed crystal portion 111a, since the penetrative dislocation $M_1$ from the seed crystal portion 111a deflects laterally in other portions corresponding to the lateral growing region, the penetrative dislocation scarcely propagates, and the penetrative dislocation density in the buffer layer 121 is decreased.

When the buffer layer 121 is grown, it is preferred that the growing rate is restricted to 6 $\mu$m/h or lower. If it is grown at a rate higher than 6 $\mu$m/h, fluctuation of the crystallographic axes in the buffer layer 121 increases and crystals laterally growing on the basis of the seed crystal portion 111a in the direction different from the laminating direction are associated to each other to result in disdvantages that it takes a long time till the grown surface of the buffer layer 121 is flattened or no flat grown surface can be obtained. Further, the growing rate is more preferably 4 $\mu$m/h or less and, further preferably, 2 $\mu$m/h or more. This is because the fluctuation of the crystallographic axes is further decreased to obtain preferred crystals at 4 $\mu$m/h or less, but the surfaces is roughened if it is lower than 2 $\mu$m/h.

Further, since the growth suppression layer 112 has a rising portion covering the base portion of the seed crystal portion 111a along the seed crystal portion 111a, this can prevent the buffer layer 121 from contact with the growth suppression layer 112 to cause defects and fluctuation of the crystallographic axes in the lateral growing region. When the rising portion is not formed in the growth suppression layer 112, it may be a worry that the crystals grown in the direction different from the laminating direction are not associated to each other and no substantially flat surface can be obtained. The seed crystal portion 111a may sometimes grow not just laterally but may proceed somewhat toward the growth suppression layer 112. However, when the height of the rising portion of the growth suppression layer 112 is 10 nm more, contact between the buffer layer 121 and the growth suppression layer 112 can be prevented effectively.

After growing the buffer layer 121, an n-type clad layer 122 comprising n-type AlGaN mixed crystals, an n-type guide layer 123 comprising n-type GaN, an active layer 124 comprising mixed crystals of undoped-GaInN with addition of an impurity, a p-type guide layer 125 comprising p-type GaN, a p-type clad layer 126 comprising p-type AlGaN mixed crystals and a p-side contact layer 127 comprising p-type GaN are grown successively on the buffer layer 121, for example, by an MOCVD method.

MOCVD is conducted by using, for example, trimethyl gallium $((CH_3)_3Ga)$ as a starting material gas for gallium, trimethyl aluminum $((CH_3)_3Al)$ as a starting material gas for aluminum, trimethyl indium $((CH_3)_3In)$ as a starting material gas for indium and ammonia $(NH_3)$ as a starting material gas for nitrogen, respectively, and further, monosilane $(SiH_4)$ as a starting material gas for silicon and bicyclopentadienyl magnesium $((C_5H_5)_2Mg)$ as a starting material gas for magnesium.

Figure 21:
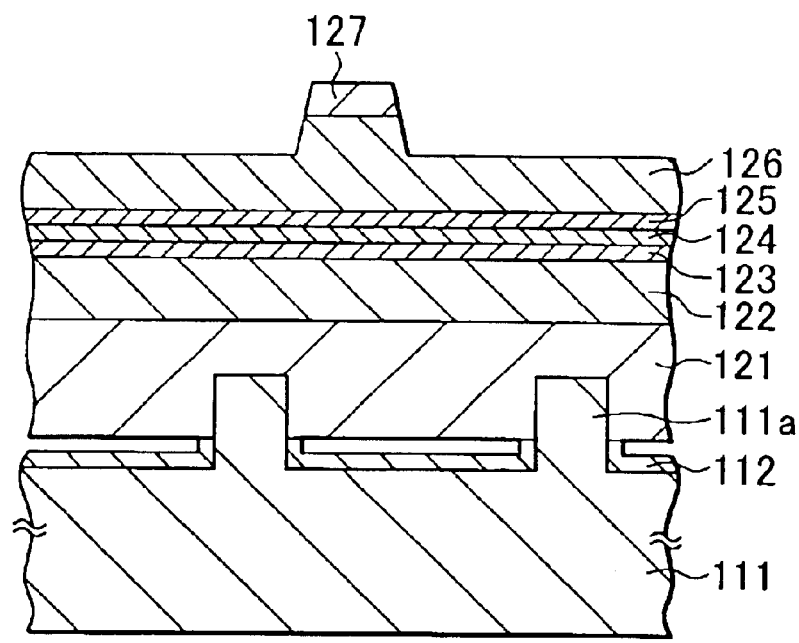
FIG. 21 is a cross sectional view illustrating a manufacturing step succeeding to FIG. 20.

After growing the p-side contact layer 127, a mask (not illustrated) is formed on the p-side contact layer 127, and the p-side contact layer 127 and a portion of the p-type. clad layer 126 are selectively etched by using the mask. The upper portion of the p-type clad layer 126 and the p-side contact layer 127 are thus formed each into a fine band shape to form a current restriction portion as shown in FIG. 21.

In this case, it is preferred that the current restriction portion is formed corresponding to the spacing region for the seed crystal portion 111a and the current injection region of the active layer 124 is formed corresponding to this region. Further, since the penetrative dislocation $M_2$ exists at the associated portion B situated at the center along the arranging direction A of the seed crystal portion 111a (refer to FIG. 17), it is more preferred to dispose the current restricted portion corresponding to a region between the seed crystal portion 111a and the center of the spacing region therefor along the arranging direction to form the injection region of the active layer 124 in this region.

Further, as described above, it is further preferred to dispose the current restriction portion, that is, the current injection region for the active layer 124 in the inside of the region being spaced apart by $\Delta L_1$ from the end C at the boundary of the seed crystal portion 111a on the side of the active layer 124 and by $\Delta L_2$ from the center of the spacing region for the seed crystal portion 111a along the arranging direction. Further, it is preferred to form the current restriction portion in the region being spaced by 0.93 $\mu$m or more from the end C of the seed crystal portion 111a and from the center of the spacing region for the seed crystal portion 111a along the arranging direction respectively, and it is further preferred to form the current restriction region in the inside of the region being spaced apart from the end C of the seed crystal portion 111a by $\Delta L_1+0.93$ ($\mu$m) or more and being spaced apart from the center of the spacing region for the seed crystal portion 111a along the arranging direction by $\Delta L_2+0.93$ ($\mu$m) or more.

After forming the current restriction portion, an insulator 113 comprising silicon dioxide is formed, for example, by a vapor deposition method over the p-type clad layer 126 and the p-side contact layer 127, and an opening is disposed corresponding to the p-side contact layer 127 to expose the p-side contact layer 127 to the surface. Then, titanium (Ti) and aluminum (Al) are vapor deposited successively on the other surface of the substrate 111 and alloyed to form an n-type electrode 115. Further, palladium, platinum, gold, etc. are successively vapor deposited to the surface of the p-side contact layer 127 and the vicinity thereof to form a p-side electrode 114. After forming the n-type electrode 115 and the p-type electrode 114, respectively, the substrate 111 is prepared into a predetermined size and reflector membranes (not illustrated) are formed to a pair of resonator end faces opposed in the longitudinal direction of the p-side contact layer 127. Thus, the semiconductor laser shown in FIG. 16 is completed.

The semiconductor operates as explained below.

In this semiconductor laser, when a predetermined voltage is applied between the p-side electrode 114 and the n-side electrode 115, current is injected into the active layer 124 and light is emitted by electron-hole recombination. The light is reflected by the reflector membranes (not illustrated) and reciprocated between them to cause laser oscillation and is emitted externally as a laser beam. In this embodiment, since the semiconductor layer 120 is grown on the basis of the seed crystal portion 111*a* of the substrate 111, the dislocation density of the semiconductor layer 120 is lowered. Particularly, when the current injection region of the active layer 124 is disposed corresponding to the lateral growing region, the dislocation density in the current injection region is further lowered. Accordingly, degradation of the device less occurs and the life time is extended.

Further, when the growth suppression layer 112 is constituted so as to have a function of reflecting or absorbing the light generated in the semiconductor layer 120 (mainly in the active layer 124), leakage of light on the side of the substrate 111 can be prevented by the growth suppression layer 112. Further, when the semiconductor laser is used being contained, for example, in a package, a portion of the emitted laser beam is reflected in the package and returns as a stray light to the semiconductor laser, but the growth suppression layer 112 can decrease the stray light intruding from the substrate 111. Accordingly, generation of noises is suppressed and characteristics such as fluctuation of power can be improved. Accordingly, stable driving can be ensured also for semiconductor lasers at low power.

As described above according to this embodiment, since the protruded seed crystal portions 111*a* are disposed to the substrate 111, the growth suppression layer 112 having the opening corresponding to the seed crystal portion 111*a* is disposed and the semiconductor layer 120 is grown on the basis of the seed crystal portion 111*a*, the dislocation density in the semiconductor layer 120 can be decreased to improve the crystallinity. Accordingly, degradation upon application of voltage less occurs and life time of the semiconductor laser can be extended. Further, the ratio of non-emissive recombination caused by the penetrative dislocation can be decreased to improve the light emission efficiency.

Particularly, since the rising portion covering the seed crystal portion 111*a* along the base portion is disposed to the growth suppression layer 112 to define a gap between the growth suppression layer 112 and the buffer layer 121, contact between the buffer layer 121 and the growth suppression layer 112 can be prevented when the buffer layer 121 is grown on the basis of the seed crystal portion 111*a*. Accordingly, density of penetrative dislocation in the semiconductor layer 120 be lowered and fluctuation of the crystallographic axes can be decreased.

Further, when the growth suppression layer 112 is constituted so as to have a function of reflecting or absorbing the light generated in the semiconductor layer 120, leakage of light on the side of the substrate 111 can be prevented, and intrusion of stray light from the substrate 111 can be prevented. Accordingly, generation of noises can be prevented and characteristics such as fluctuation can be improved. Accordingly, stable driving can be ensured also for semiconductor lasers at low power.

Further, when the current injection region for the active layer 124 is disposed corresponding to the lateral growing region, the light emission efficiency can be improved further. Further, when the current injection region is disposed corresponding to the region between the seed crystal portion 111*a* and the associated portion B, the light emission efficiency can be improved further. Further, when the current injection region is disposed corresponding to the region spaced apart from the seed crystal portion 111*a* by $\Delta L_2$ or more and spaced apart from the associated portion B by $\Delta L_2$ or more, or when the current injection region is disposed corresponding to the inside of the region spaced apart from each of the seed crystal portion 111*a* and the associated portion B by 0.93 $\mu$m or more respectively, a higher effect can be obtained.

While this invention has been described above with reference to the preferred embodiment, this invention is not restricted to the preferred embodiment but can be modified variously. For example, in the preferred embodiment, explanations has been made to a case of providing a plurality of band-like seed crystal portions 111*a*, but only one portion may be disposed finally depending on the size of the device.

Further, in the preferred embodiment described above, the seed crystal portion 111*a* is disposed to the (0001) face of the substrate 111 but it may be disposed on other crystal faces. Further, while the seed crystal portion 111*a* is formed by being extended in the direction shown by the indication described above, it may be formed being extended in other directions.

Further, in the embodiment described above, description has been made to a case of using the substrate 111 formed by growing on a substrate comprising sapphire or the like to be used for growing but this invention is applicable also to a case of using substrates prepared by other methods.

In addition, the buffer layer 121 is formed after removing the mask layer 131 in the preferred embodiment described above, but the buffer layer 121 may be formed without removing the mask layer 131 on the seed crystal portion 111*a*. This can interrupt the penetrative dislocation $M_1$ by the mask layer 131 to prevent propagation of the penetrative dislocation $M_1$ from the seed crystal portion 111*a*. Accordingly, crystal defects scarcely exist in the buffer layer 121 except for the penetrative dislocation $M_2$ caused by association and the semiconductor layer 120 having excellent crystallinity can be obtained. However, when the buffer layer 121 is grown, it may be a worry that the constituent material for the mask layer 131 may intrude as an impurity into the buffer layer 121 to deteriorate the characteristics of the semiconductor laser, so that it is preferred to select an appropriate manufacturing method depending on the purpose of use or the like.

Figure 22:
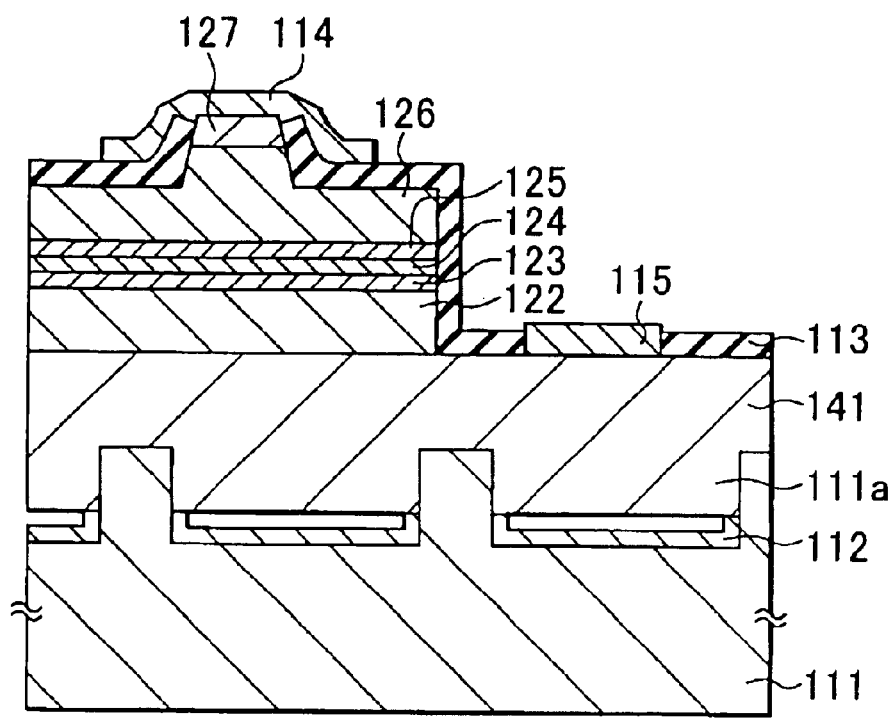
FIG. 22 is a cross sectional view illustrating a modified embodiment of the semiconductor laser shown in FIG. 16.

Furthermore, in the preferred embodiment described above, while the constitution of the semiconductor laser has been explained by the specific example, this invention is applicable also to semiconductor lasers of other structures in the same manner. For example, as shown in FIG. 22, an n-side contact layer 141 comprising an n-type GaN may be formed instead of the buffer layer 121 and the n-side electrode 115 may be disposed to the substrate 111 on the side identical with the p-side electrode 114. In this case, the substrate 111 may be constituted with an n-type GaN or with GaN with no addition of an impurity.

Further, the n-type guide layer 123 and the p-type guide layer 125 may be saved or a degradation preventive layer may be disposed between the active layer 124 and the p-type guide layer 125. Further, in the preferred embodiment described above, while explanation has been made to an example of a ridge waveguide type semiconductor laser comprising a gain waveguide type and a refractive index waveguide type in combination, it is applicable also to a gain waveguide type semiconductor laser and a refractive index waveguide type semiconductor laser.

In addition, in the preferred embodiment described above, the semiconductor layer 120 is grown by the MOCVD method but it may be formed by other vapor deposition method such as an MBE (Molecular Beam Epitaxy) method, a hydride vapor deposition method or a halide vapor deposition method.

Furthermore, while the explanation has been made with reference to the semiconductor laser as the concrete example in the preferred embodiment described above, this invention is applicable also to other semiconductor laser devices such as light emission diodes or field effect transistors.

What is claimed is:

1. A semiconductor laser comprising:
   a substrate;
   a plurality of spaced apart seed crystal layers grown directly on the substrate, each seed crystal layer being composed of a compound semiconductor from a nitride series III–V group and spaced from adjacent seed layers in an arranging direction; and
   a crystal growth layer composed of a compound semiconductor from a nitride series III–V group and grown on the seed crystal layer in a laminating direction;
   wherein each seed crystal layer has a width measured in micrometers at a boundary between the respective seed crystal layer and the crystal growth layer in the arranging direction and a thickness measured in micrometers in the laminating direction; and
   wherein each seed crystal layer is sized such that a product of the width and the thickness is no more than 15.

2. A semiconductor laser as defined in claim 1, wherein the product of each seed crystal layer is at least 2.25.

3. A semiconductor laser as defined in claim 1, wherein the product of each seed crystal layer is no more than 10.

4. A semiconductor laser as defined in claim 1, wherein the product of each seed crystal layer is no more than 8.

5. A semiconductor laser as defined in claim 1, wherein the product of each seed crystal layer is no more than 6.

6. A semiconductor laser as defined in claim 1, wherein the crystal growth layer has an active layer and contains an associated portion formed by growing along the arranging direction of the seed crystal layer, the active layer having an injection region injected with current corresponding to a region between the seed crystal layer and the associated portion.

7. A semiconductor laser as defined in claim 6, wherein the injection region in the active layer is disposed corresponding to a region spaced apart from the seed crystal layers along the arranging direction thereof by at least $(t_2-t_1)/20$, and spaced apart from the associated portion along the arranging direction of the seed crystal layer by at least $t_2/20$;
   wherein $t_1$ represents the thickness of each seed crystal layer measured in micrometers in the laminating direction of the crystal growth layer; and
   wherein $t_2$ represents the thickness of the crystal growth layer measured in micrometers in the laminating direction of the crystal growth layer.

8. A semiconductor laser as defined in claim 1, wherein the seed crystal layer has a half-width of a rocking curve by X-ray diffraction obtained upon incidence of X-rays from a side of the boundary thereof of no more than 300 arcsec.

9. A semiconductor laser as defined in claim 1, wherein a spacing distance between adjacent seed crystal layers measured in the arranging direction is at least 9 $\mu$m.

10. A semiconductor laser as defined in claim 1, wherein the substrate has a concave portion corresponding to a spacing region between the seed crystal layers.

11. A semiconductor device comprising:
    a substrate;
    a plurality of spaced apart seed crystal layers grown directly on the substrate, each seed crystal layer being composed of a compound semiconductor from a nitride series III–V group and spaced from adjacent seed layers in an arranging direction; and
    a crystal growth layer composed of a compound semiconductor from a nitride series III–V group and grown on the seed crystal layer in a laminating direction;
    wherein each seed crystal layer has a width measured in micrometers at a boundary between the respective seed crystal layer and the crystal growth layer in the arranging direction and a thickness measured in micrometers in the laminating direction; and
    wherein each seed crystal layer is sized such that a product of the width and the thickness is no more than 15.

12. A nitride series III–V group compound substrate comprising:
    a plurality of spaced apart seed crystal layers grown directly on a base substrate, each seed crystal layer being composed of a compound semiconductor from a nitride series III–V group and spaced from adjacent seed layers in an arranging direction; and
    a crystal growth layer composed of a compound semiconductor from a nitride series III–V group and grown on the seed crystal layer in a laminating direction;
    wherein each seed crystal layer has a width measured in micrometers at a boundary between the respective seed crystal layer and the crystal growth layer in the arranging direction and a thickness measured in micrometers in the laminating direction; and
    wherein each seed crystal layer is sized such that a product of the width and the thickness is no more than 15.

13. A semiconductor laser comprising:
    a substrate;
    seed crystal portions protruding from the substrate and composed of a compound from a nitride series III–V;
    a semiconductor layer composed of a compound semiconductor from a nitride series III–V group, grown on the seed crystal portions, and laminated to the substrate; and
    growth suppression layer disposed between the substrate and the semiconductor layer and having an opening corresponding to each seed crystal portion.

14. A semiconductor laser as defined in claim 13, wherein a gap is formed between the semiconductor layer and the growth suppression layer.

15. A semiconductor laser as defined in claim 13, wherein the growth suppression layer has a function of one of reflecting and absorbing light generated in the semiconductor layer.

16. A semiconductor laser as defined in claim 13, wherein the semiconductr layer has an active layer, said active layer having a current injection region injected with a current, said semiconductor layer containing a lateral growing region formed by growing of the semiconductor layer in a direction different from a laminating direction, and wherein said current injection region of said active layer corresponds to said lateral growing region.

17. A semiconductor laser as defined in claim 16, wherein the semiconductor layer contains an associated portion formed by the growing of the semiconductor layer in the direction different from the laminating direction, and the active layer has a current injection region in the lateral growing region corresponding to a region between the seed crystal portion and the associated portion.

18. A semiconductor device comprising:

a substrate;

seed crystal portions protruding from the substrate and composed of a compound from a nitride series III–V group;

a semiconductor layer composed of a compound semiconductor from a nitride series III–V group, grown on the seed crystal portions and laminated to the substrate; and a growth suppression layer disposed between the substrate and the semiconductor layer and having openings corresponding to the seed crystal portions.

\* \* \* \* \*